US012805089B2

(12) United States Patent
Kwon et al.

(10) Patent No.: US 12,805,089 B2
(45) Date of Patent: Nov. 17, 2026

(54) DISPLAY DEVICE

(71) Applicant: LG ELECTRONICS INC., Seoul (KR)

(72) Inventors: Jeonghyo Kwon, Seoul (KR); Wonseok Choi, Seoul (KR); Junoh Shin, Seoul (KR); Sungmin Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 357 days.

(21) Appl. No.: 18/572,064

(22) PCT Filed: Jun. 30, 2021

(86) PCT No.: PCT/KR2021/008246
§ 371 (c)(1),
(2) Date: Dec. 19, 2023

(87) PCT Pub. No.: WO2023/277215
PCT Pub. Date: Jan. 5, 2023

(65) Prior Publication Data
US 2024/0363818 A1 Oct. 31, 2024

(51) Int. Cl.
*H01L 33/62* (2010.01)
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC ...... H10H 20/857; H10H 20/85; H10H 29/10; H10H 29/142; H10H 29/832–832;
(Continued)

(56) References Cited

U.S. PATENT DOCUMENTS

2021/0159250 A1* 5/2021 Chang .................. G09G 3/3233
2021/0265327 A1 8/2021 Koo et al.
(Continued)

FOREIGN PATENT DOCUMENTS

KR 10-2019-0104277 A 9/2019
KR 10-2019-0113695 A 10/2019
(Continued)

OTHER PUBLICATIONS

International Search Report for PCT/KR2021/008246 mailed on Mar. 28, 2022.

*Primary Examiner* — Cuong B Nguyen
(74) *Attorney, Agent, or Firm* — Birch, Stewart, Kolasch & Birch, LLP

(57) ABSTRACT

The display device can comprise a first wiring, a second wiring disposed on a different layer from the first wiring, a pad disposed on the same layer as the second wiring and that vertically overlaps the first wiring, and on the pad and the second wiring. It is disposed and can comprise an insulating layer having an assembly hole, and a semiconductor light emitting device disposed on a pad and a second wiring within the assembly hole. The embodiment prevents separation of the semiconductor light emitting device, improves the light efficiency of the semiconductor light emitting device to implement high luminance, and significantly improves light efficiency, thereby implementing further improved high resolution.

17 Claims, 19 Drawing Sheets

(58) Field of Classification Search
CPC ............... H10H 20/032; H10H 29/032; H10H 29/30–962; H10W 90/00; H10D 86/00; H10D 86/451; H10D 86/441; H10K 50/813; H10K 50/822
See application file for complete search history.

(56) References Cited

U.S. PATENT DOCUMENTS

| | | | |
|---|---|---|---|
| 2022/0068876 | A1 | 3/2022 | Do et al. |
| 2022/0223575 | A1 | 7/2022 | Kim et al. |
| 2022/0254961 | A1 | 8/2022 | Chang et al. |
| 2022/0351993 | A1 | 11/2022 | Jeong et al. |
| 2022/0367774 | A1 | 11/2022 | Kim et al. |
| 2022/0375915 | A1 | 11/2022 | Kim et al. |

FOREIGN PATENT DOCUMENTS

| | | | |
|---|---|---|---|
| KR | 10-2019-0126260 | A | 11/2019 |
| KR | 10-2020-0007498 | A | 1/2020 |
| KR | 10-2020-0026681 | A | 3/2020 |
| KR | 10-2020-0039557 | A | 4/2020 |
| KR | 10-2020-0088949 | A | 7/2020 |
| KR | 10-2020-0115868 | A | 10/2020 |

* cited by examiner (a)

(b)

(c)

(d)

DISPLAY DEVICE

CROSS REFERENCE TO RELATED APPLICATION

This application is the National Phase of PCT International Application No. PCT/KR2021/008246, filed on Jun. 30, 2021, which is hereby expressly incorporated by reference into the present application.

TECHNICAL FIELD

The embodiment relates to a display device.

BACKGROUND ART

A display device displays high-definition image using self-emissive element such as a light emitting diode as a light source for a pixel. The light emitting diode exhibits excellent durability even under harsh environmental conditions and is capable of long lifespan and high luminance, so that it is attracting attention as a light source for next-generation display devices.

Recently, research is in progress to manufacture ultra-small light emitting diodes using highly a material having reliable inorganic crystal structure and dispose them on the panel of a display device (hereinafter referred to as "display panel") to use them as a light source for a next-generation pixel.

In order to implement high resolution, the size of the pixel is gradually becoming smaller, and numerous light emitting devices must be aligned in the smaller pixel, so that research on the manufacture of ultra-small light emitting diodes as small as micro or nanoscale is actively taking place A display panel typically can comprise millions of pixels. Therefore, because it is very difficult to align light emitting devices in each of the millions of small pixels, various studies on ways to align light emitting devices in the display panel are being actively conducted recently.

As the size of light emitting devices becomes smaller, transferring these light emitting devices onto a substrate is becoming a very important problem to solve. Transfer technologies that have been recently developed comprise the pick and place method, the laser lift-off method, or self-assembly method. In particular, a self-assembly method that transfers a light emitting device onto a substrate using a magnetic material (or magnet) has recently been in the spotlight.

Typically, in the self-assembly method, a light emitting device is assembled in an assembly hole by the dielectrophoresis force between the first and second assembling wirings disposed side by side on the substrate.

Recently, as the size of each sub-pixel becomes smaller to implement high-resolution displays, the gap between the first and second assembling wirings is also narrowing. However, since the lower wiring electrode of the light emitting device must be disposed between the first and second assembling wirings, there is a limit to narrowing the gap between the first and second assembling wirings.

Therefore, optimization of the assembling wiring structure for implementing high-resolution displays is urgently required.

Meanwhile, in order to implement an ultra-small light emitting device-based display, stable bonding must be possible and high luminance or uniform luminance between pixels must be secured.

DISCLOSURE

Technical Problem

An object of the embodiment is to solve the foregoing and other problems.

Another purpose of the embodiment is to provide a display device capable of implementing a high-resolution display.

Another purpose of the embodiment is to provide a display device that can prevent bonding defects.

Another purpose of the embodiment is to provide a display device capable of implementing high luminance.

Another purpose of the embodiment is to provide a display device that can secure uniform luminance between pixels.

The technical problem of the embodiment may be not limited to those described in this section, and comprise those that can be grasped through the description of the invention.

Technical Solution

In order to achieve the above or other objects, according to one aspect of the embodiment, a display device, comprising: a first wiring; a second wiring disposed on a different layer from the first wiring; a pad disposed on the same layer as the second wiring and that vertically overlaps the first wiring; an insulating layer disposed on the pad and the second wiring and having an assembly hole; and a semiconductor light emitting device disposed on the pad and the second wiring in the assembly hole The second wiring is an upper assembly wiring for assembling the semiconductor light emitting device together with the first wiring.

The pad and the second wiring are lower wire electrodes for supplying an electrical signal to the semiconductor light emitting device.

The pad is an alleviation member that alleviates the dielectrophoretic force concentrated on the first wiring.

The pad comprises a first pad area that vertically overlaps the assembly hole, and a second pad area that does not overlap the assembly hole.

The first wiring comprises a first extension part extending toward the second wiring, the second wiring comprises a second extension part extending toward the first wiring, the pad vertically overlaps the first extension part, and the semiconductor light emitting device is disposed on the pad and the second extension part within the assembly hole.

The first extension part comprises a first extension area that extends toward the second wiring and vertically overlaps the pad, and a second extension area that extends from the first extension area toward the second wiring and does not vertically overlap the pad.

The pad comprises a connection part, and a plurality of branch parts extending from the connection part toward the second extension part and being spaced apart from each other.

The second extension part comprises a connection part, and a plurality of branch parts extending from the connection part toward the first extension part and being spaced apart from each other.

Advantageous Effects

The embodiment alleviates the distribution of the electric field concentrated on the first wiring, so that that the semiconductor light emitting device can be positioned in the correct position within the assembly hole, that is, at the center of the assembly hole (FIG. 15). In this way, by positioning the semiconductor light emitting device at the center of the assembly hole, the contact area between the semiconductor light emitting device and the second wiring can be increased.

Accordingly, the semiconductor light emitting device can be more strongly bonded to the second wiring, thereby preventing the semiconductor light emitting device from being separated. In addition, the electrical signal are more smoothly supplied to the semiconductor light emitting device through the second wiring, thereby improving the optical efficiency of the semiconductor light emitting device to implement high luminance.

In particular, when the pad is electrically connected to the second wiring after self-assembly, the electrical signal can be supplied not only through the second wiring but also through the pad, so that as current flows in a wider area of the semiconductor light emitting device, light efficiency is significantly improved, enabling even improved high resolution.

In addition, since the semiconductor light emitting device in each pixel is positioned at the center of the assembly hole, uniform luminance can be secured without luminance deviation between each pixel, improving image quality and improving product reliability.

A further scope of applicability of the embodiment will become apparent from the detailed description that follows. However, since various changes and modifications within the spirit and scope of the embodiment can be clearly understood by those skilled in the art, it should be understood that the detailed description and specific embodiment, such as preferred embodiment, are given by way of example only.

MODE FOR INVENTION

Figure 1:
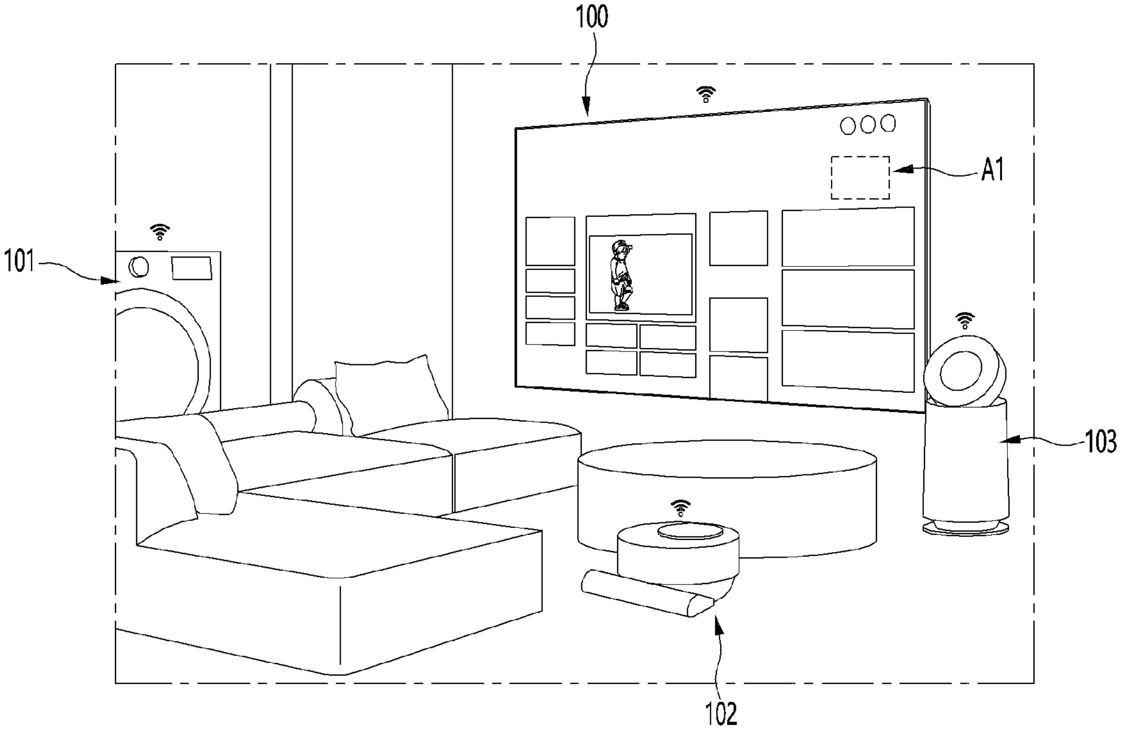
FIG. 1 shows a living room of a house where a display device 100 according to an embodiment is placed.

Hereinafter, the embodiment disclosed in this specification will be described in detail with reference to the accompanying drawings, but the same or similar components are given the same reference numerals regardless of reference numerals, and redundant descriptions thereof will be omitted. The suffixes 'module' and 'unit' for the components used in the following descriptions are given or used interchangeably in consideration of ease of writing the specification, and do not themselves have a meaning or role that is distinct from each other. In addition, the accompanying drawings are for easy understanding of the embodiment disclosed in this specification, and the technical idea disclosed in this specification may be not limited by the accompanying drawings. Also, when a component such as a layer, region or substrate is referred to as being 'on' another component, this means that there can be directly on the other component or be other intermediate components therebetween.

The display device described in this specification comprise a mobile phone, a smart phone, a laptop computer, a digital broadcasting terminal, a personal digital assistant (PDA), a portable multimedia player (PMP), a navigation, a slate personal computer (PC), a tablet PC, an ultra-book, a digital TV, a desktop computer, etc. However, the configuration according to the embodiment described in this specification can be applied to a device capable of displaying even if it is a new product type that is developed in the future.

Hereinafter, a light emitting device according to an embodiment and a display device comprising the same will be described.

FIG. 1 shows a living room of a house where a display device 100 according to an embodiment is placed.

The display device 100 of the embodiment can display the status of various electronic products such as a washing machine 101, a robot cleaner 102, and an air purifier 103, can communicate with each electronic product based on an internet of things (IoT), can control each electronic product based on the user's setting data.

The display device 100 according to the embodiment can comprise a flexible display manufactured on a thin and flexible substrate. The flexible display can bend or curl like paper while maintaining the characteristics of existing flat display.

In a flexible display, visual information can be implemented by independently controlling the light emission of unit pixels disposed in a matrix form. A unit pixel refers to the minimum unit for implementing one color. A unit pixel of a flexible display can be implemented by a light emitting device. In the embodiment, the light emitting device can be a micro-LED or nano-LED, but is not limited thereto.

Figure 2:
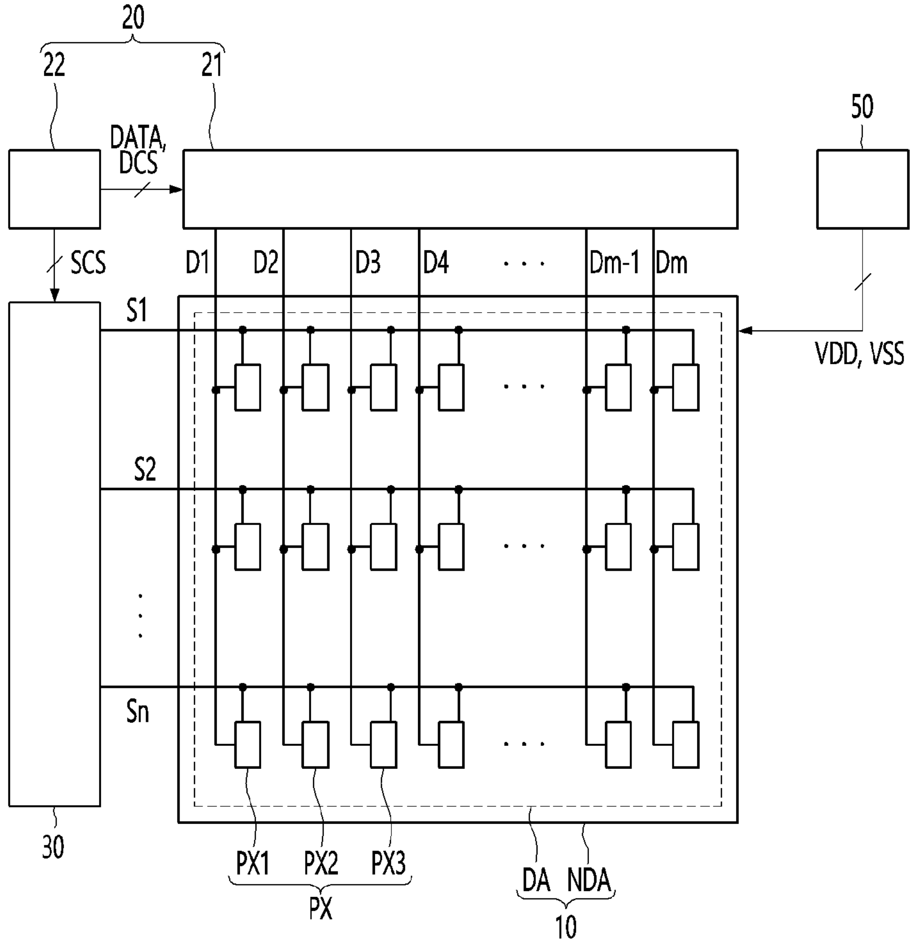
FIG. 2 is a block diagram schematically showing a display device according to an embodiment.
Figure 3:
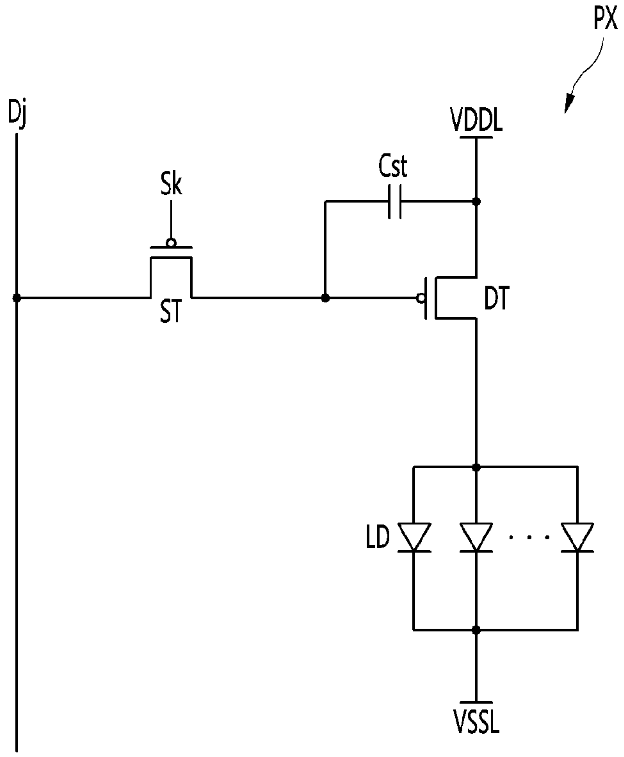
FIG. 3 is a circuit diagram showing an example of the pixel of FIG. 2.

FIG. 2 is a block diagram schematically showing a display device according to an embodiment, and FIG. 3 is a circuit diagram showing an example of the pixel of FIG. 2.

Referring to FIGS. 2 and 3, a display device according to an embodiment can comprise a display panel 10, a driving circuit 20, a scan driving device 30, and a power supply circuit 50.

The display device 100 of the embodiment can drive the light emitting device in an active matrix (AM) method or a passive matrix (PM) method.

The driving circuit 20 can comprise a data driving device 21 and a timing controller 22.

The display panel 10 can be rectangular, but is not limited thereto. That is, the display panel 10 can be formed in a circular or oval shape. At least one side of the display panel 10 can be bent to a predetermined curvature.

The display panel 10 can be divided into a display area DA and a non-display area NDA disposed around the display area DA. The display area DA is an area where pixels PX are formed to display an image. The display panel 10 can comprise data lines (D1 to Dm, m is an integer greater than 2), scan lines (S1 to Sn, n is an integer greater than 2) that intersect the data lines D1 to Dm, a high potential voltage line supplied with high potential voltage, a low potential voltage line supplied with low potential voltage, and pixels PX connected to the data lines D1 to Dm and the scan lines S1 to Sn.

Each of the pixels PX can comprise a first sub-pixel PX1, a second sub-pixel PX2, and a third sub-pixel PX3. The first sub-pixel PX1 can emit a first color light of a first main wavelength, the second sub-pixel PX2 can emit a second color light of a second main wavelength, and the third sub-pixel PX3 can emit a third color light of a third main wavelength. The first color light can be red light, the second color light can be green light, and the third color light can be blue light, but are not limited thereto. Additionally, in FIG. 2, it is illustrated that each of the pixels PX can comprise three sub-pixels, but is not limited thereto. That is, each pixel PX can comprise four or more sub-pixels.

The first sub-pixel PX1, the second sub-pixel PX2, and the third sub-pixel PX3 each can be connected to at least one of the data lines D1 to Dm, at least one of the scan lines S1 to Sn, and the high potential voltage line. As shown in FIG. 3, the first sub-pixel PX1 can comprise light emitting devices LD, a plurality of transistors for supplying current to the light emitting devices LD, and at least one capacitor Cst.

Although not shown in the drawing, each of the first sub-pixel PX1, the second sub-pixel PX2, and the third sub-pixel PX3 can comprise only one light emitting device LD and at least one capacitor Cst.

Each of the light emitting devices LD can be a semiconductor light emitting diode comprising a first electrode, a plurality of conductivity type semiconductor layers, and a second electrode. Here, the first electrode can be an anode electrode and the second electrode can be a cathode electrode, but is not limited thereto.

As shown in FIG. 3, the plurality of transistors can comprise a driving transistor DT that supplies current to the light emitting devices LD and a scan transistor ST that supplies a data voltage to the gate electrode of the driving transistor DT. The driving transistor DT can comprise a gate electrode connected to a source electrode of the scan transistor ST, a source electrode connected to a high potential voltage line to which a high potential voltage is applied, and a drain electrode connected to the first electrodes of the light emitting devices LD. The scan transistor ST can comprise a gate electrode connected to the scan line (Sk, k is an integer satisfying $1 \leq k \leq n$), a source electrode connected to the gate electrode of the driving transistor DT, and a drain electrode connected to a data line (Dj, j is an integer satisfying $1 \leq j \leq m$.

The capacitor Cst is formed between the gate electrode and the source electrode of the driving transistor DT. The storage capacitor Cst charges the difference between the gate voltage and the source voltage of the driving transistor DT.

The driving transistor DT and the scan transistor ST can be formed of a thin film transistor. In addition, in FIG. 3, the driving transistor DT and the scan transistor ST are mainly described as being formed of a P-type metal oxide semiconductor field-effect transistor (MOSFET), but is not limited thereto. The driving transistor DT and the scan transistor ST can be formed of an N-type MOSFET. In this instance, the positions of the source and drain electrodes of each of the driving transistor DT and scan transistor ST can be changed.

In addition, in FIG. 3, it is illustrated in which each of the first sub-pixel PX1, the second sub-pixel PX2, and the third sub-pixel PX3 has one driving transistor DT, one scan transistor ST, and one capacitor Cst, but is not limited thereto. Each of the first sub-pixel PX1, the second sub-pixel PX2, and the third sub-pixel PX3 can comprise a plurality of scan transistors ST and a plurality of capacitors Cst.

Since the second sub-pixel PX2 and the third sub-pixel PX3 can be represented by substantially the same circuit diagram as the first sub-pixel PX1, detailed descriptions thereof will be omitted.

The driving circuit 20 outputs signals and voltages for driving the display panel 10. For this purpose, the driving circuit 20 can comprise a data driving device 21 and a timing controller 22.

The data driving device 21 receives digital video data DATA and source control signal DCS from the timing controller 22. The data driving device 21 converts digital video data DATA into analog data voltages according to the source control signal DCS and supplies them to the data lines D1 to Dm of the display panel 10.

The timing controller 22 receives digital video data DATA and timing signals from the host system. The timing signals can comprise a vertical synchronization signal, a horizontal synchronization signal, a data enable signal, and a dot clock. The host system can be an application processor in a smartphone or tablet PC, a monitor, or a system-on-chip in a TV.

The timing controller 22 generates control signals to control the operation timing of the data driving device 21 and the scan driving device 30. The control signals can comprise a source control signal DCS for controlling the operation timing of the data driving device 21 and a scan control signal SCS for controlling the operation timing of the scan driving device 30.

The driving circuit 20 can be disposed in the non-display area NDA provided on one side of the display panel 10. The driving circuit 20 can be formed of an integrated circuit IC and mounted on the display panel 10 using a chip on glass COG method, a chip on plastic COP method, or an ultrasonic bonding method, but is not limited to thereto. For example, the driving circuit 20 can be mounted on a circuit board (not shown) rather than on the display panel 10.

The data driving device 21 can be mounted on the display panel 10 using a COG method, a COP method, or an ultrasonic bonding method, and the timing control unit 22 can be mounted on a circuit board.

The scan driving device 30 receives a scan control signal SCS from the timing controller 22. The scan driving device 30 generates scan signals according to the scan control signal SCS and supplies them to the scan lines S1 to Sn of the display panel 10. The scan driving device 30 can comprise a plurality of transistors and can be formed in the non-display area NDA of the display panel 10. Alternatively, the scan driving device 30 can be formed as an integrated circuit, and in this instance, can be mounted on a gate flexible film attached to the other side of the display panel 10.

The circuit board can be attached to pads provided at one edge of the display panel 10 using an anisotropic conductive film. For this reason, the lead lines of the circuit board can be electrically connected to the pads. The circuit board can be a flexible printed circuit board, a printed circuit board, or a flexible film such as a chip on film. The circuit board can be bent toward the bottom of the display panel 10. For this reason, one side of the circuit board can be attached to one edge of the display panel 10, and the other side can be disposed below the display panel 10 and can be connected to a system board on which the host system is mounted.

The power supply circuit 50 can generate voltages necessary for driving the display panel 10 from the main power supplied from the system board and supply them to the display panel 10. For example, the power supply circuit 50 can generate a high potential voltage VDD and a low potential voltage VSS for driving the light emitting devices LD of the display panel 10 from the main power supply to supply the high potential voltage VDD and the low potential voltage VSS to high potential voltage line and low potential voltage line. Additionally, the power supply circuit 50 can generate and supply driving voltages for driving the driving circuit 20 and the scan driving device 30 from the main power supply.

Figure 4:
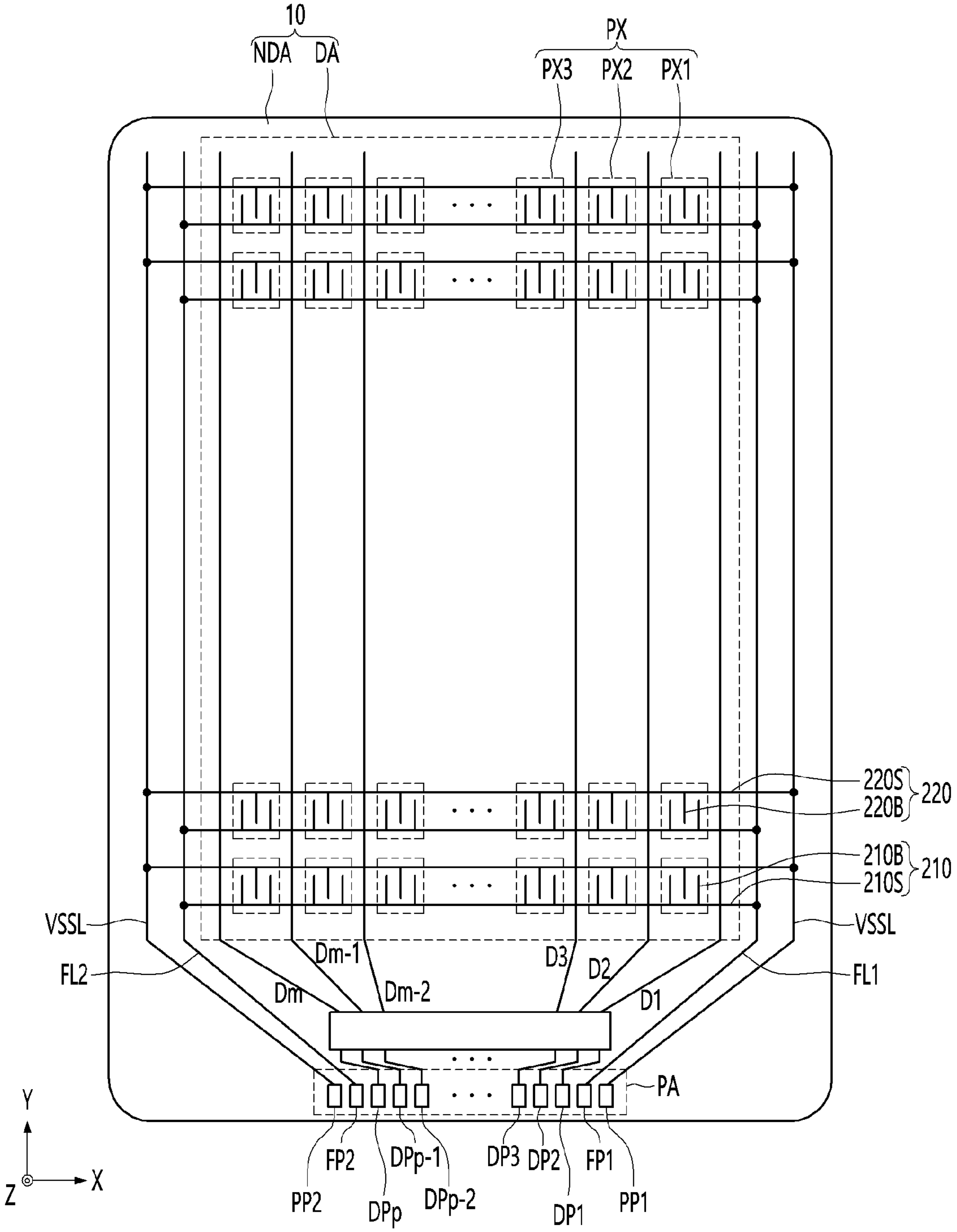
FIG. 4 is a plan view showing the display panel of FIG. 2 in detail.

FIG. 4 is a plan view showing the display panel of FIG. 2 in detail. In FIG. 4, for convenience of explanation, only the data pads (DP1 to DPp, p is an integer of 2 or more), the floating pads FP1 and FP2, the power pads PP1 and PP2, the floating lines FL1 and FL2, the low potential voltage line VSSL, the data lines D1 to Dm, the first pad electrodes 210, and the second pad electrodes 220 are shown.

Referring to FIG. 4, the data lines D1 to Dm, the first pad electrodes 210, the second pad electrodes 220, and the pixels PX can be disposed in the display area DA of the display panel 10.

The data lines D1 to Dm can extend long in the second direction (Y-axis direction). One side of the data lines D1 to Dm can be connected to the driving circuit (20 in FIG. 2). For this reason, the data voltages of the driving circuit 20 can be applied to the data lines D1 to Dm.

The first pad electrodes 210 can be disposed to be spaced apart at predetermined distance in the first direction (X-axis direction). For this reason, the first pad electrodes 210 may not overlap the data lines D1 to Dm. Among the first pad electrodes 210, the first pad electrodes 210 disposed at the right edge of the display area DA can be connected to the first floating line FL1 in the non-display area NDA. Among the first pad electrodes 210, the first pad electrodes 210 disposed at the left edge of the display area DA can be connected to the second floating line FL2 in the non-display area NDA.

Each of the second pad electrodes 220 can extend long in the first direction (X-axis direction). For this reason, the second pad electrodes 220 can overlap the data lines D1 to Dm. Additionally, the second pad electrodes 220 can be connected to the low potential voltage line VSSL in the non-display area NDA. For this reason, the low potential voltage of the low potential voltage line VSSL can be applied to the second pad electrodes 220.

A pad portion PA, the driving circuit 20, the first floating line FL1, the second floating line FL2, and the low potential voltage line VSSL can be disposed in the non-display area NDA of the display panel 10. The pad portion PA can comprise the data pads DP1 to DPp, the floating pads FP1 and FP2, and the power pads PP1 and PP2.

The pad portion PA can be disposed at one edge of the display panel 10, for example, at the lower edge. The data pads DP1 to DPp, the floating pads FP1 and FP2, and the power pads PP1 and PP2 can be disposed side by side in the first direction (X-axis direction) in the pad portion PA.

A circuit board can be attached to the data pads DP1 to DPp, the floating pads FP1 and FP2, and the power pads PP1 and PP2 using an anisotropic conductive film. For this reason, the circuit board, the data pads DP1 to DPp, the floating pads FP1 and FP2, and the power pads PP1 and PP2 can be electrically connected.

The driving circuit 20 can be connected to the data pads DP1 to DPp through link lines. The driving circuit 20 can receive digital video data DATA and timing signals through the data pads DP1 to DPp. The driving circuit 20 can convert digital video data DATA into analog data voltages and supply them to the data lines D1 to Dm of the display panel 10.

The low potential voltage line VSSL can be connected to the first power pad PP1 and the second power pad PP2 of the pad portion PA. The low potential voltage line VSSL can extend long in the second direction (Y-axis direction) from the non-display area NDA outside the left and right sides of the display area DA. The low potential voltage line VSSL can be connected to the second pad electrode 220. For this reason, the low potential voltage of the power supply circuit 50 can be applied to the second pad electrode 220 through the circuit board, the first power pad PP1, the second power pad PP2, and the low potential voltage line VSSL.

The first floating line FL1 can be connected to the first floating pad FP1 of the pad portion PA. The first floating line FL1 can extend long in the second direction (Y-axis direction) from the non-display area NDA outside the left and right sides of the display area DA. The first floating pad FP1 and the first floating line FL1 can be dummy pads and dummy lines to which no voltage is applied.

The second floating line FL2 can be connected to the second floating pad FP2 of the pad portion PA. The first floating line FL1 can extend long in the second direction (Y-axis direction) from the non-display area NDA outside the left and right sides of the display area DA. The second floating pad FP2 and the second floating line FL2 can be dummy pads and dummy lines to which no voltage is applied.

Meanwhile, since the light emitting devices (LD in FIG. 3) have a very small size, it is very difficult to mount the light emitting elements LD into the first sub-pixel PX1, the second sub-pixel PX2, and the third sub-pixel PX3 of each of the pixels PX.

To solve this problem, an alignment method using dielectrophoresis was proposed.

That is, in order to align the light emitting devices (310, 320, and 330 in FIG. 14) during the manufacturing process of the display panel 10, an electric field can be formed in the first sub-pixel PX1, the second sub-pixel PX2, and the third sub-pixel PX3 of each of the pixels PX. Specifically, during the manufacturing process, a dielectrophoresis force can be applied to the light emitting devices 310, 320, and 330 using a dielectrophoretic method, so that that the light emitting elements 310, 320, and 330 can be aligned in each of the first sub-pixel PX1, the second sub-pixel PX2, and the third sub-pixel PX3.

However, during the manufacturing process, it is difficult to drive the thin film transistors and apply a ground voltage to the first pad electrodes 210.

Therefore, in the completed display device, the first pad electrodes 210 can be disposed to be spaced apart at predetermined distance in the first direction (X-axis direction), but during the manufacturing process, the first pad electrodes 210 may be not disconnected in the first direction (X-axis direction) but may be disposed to extend long.

For this reason, the first pad electrodes 210 can be connected to the first floating line FL1 and the second floating line FL2 during the manufacturing process. Therefore, the first pad electrodes 210 can receive the ground voltage through the first floating line FL1 and the second floating line FL2. Therefore, after aligning the light emitting devices 310, 320, and 330 using a dielectrophoresis method during the manufacturing process, the first pad electrodes 210 can be disconnected, so that that the first pad electrodes 210 may be disposed to be spaced apart at predetermined distance in the first direction (X-axis direction).

Meanwhile, the first floating line FL1 and the second floating line FL2 can be lines for applying the ground voltage during the manufacturing process, and no voltage can be applied in the completed display device. Alternatively, in the completed display device, the ground voltage can be applied to the first floating line FL1 and the second floating line FL2 to prevent static electricity or to drive the light emitting devices 310, 320, and 330.

Figure 5:
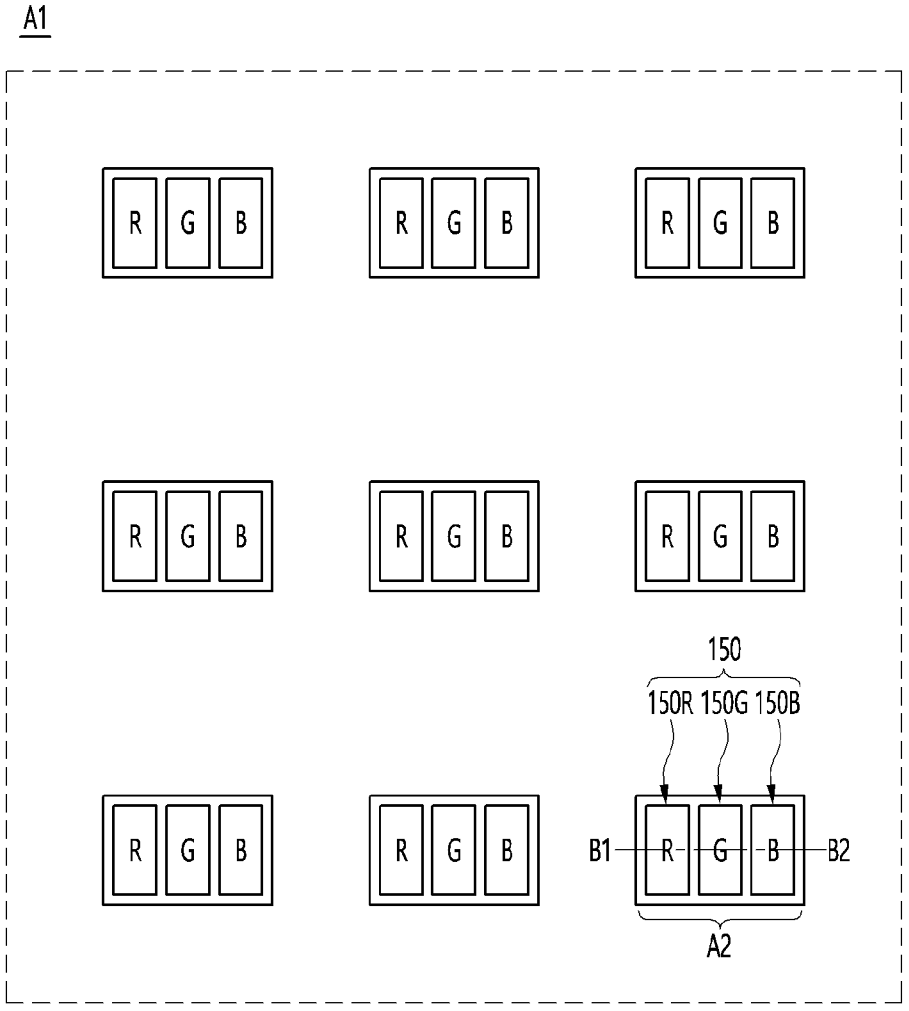
FIG. 5 is an enlarged view of a first panel area in the display device of FIG. 1.

FIG. 5 is an enlarged view of a first panel area in the display device of FIG. 1.

According to FIG. 5, the display device 100 of the embodiment can be manufactured by mechanically and electrically connecting a plurality of panel areas, such as the first panel area A1, by tiling.

The first panel area A1 can comprise a plurality of light emitting devices 150 disposed for each unit pixel (PX in FIG. 2).

For example, the unit pixel PX can comprise a first sub-pixel PX1, a second sub-pixel PX2, and a third sub-pixel PX3. For example, a plurality of red light emitting devices 150R can be disposed in the first sub-pixel PX1, a plurality of green light emitting devices 150G can be disposed in the second sub-pixel PX2, and a plurality of blue light emitting devices 150B can be disposed in the third sub-pixel PX3. The unit pixel PX can further comprise a fourth sub-pixel in which no light emitting device is disposed, but is not limited thereto.

Figure 14:
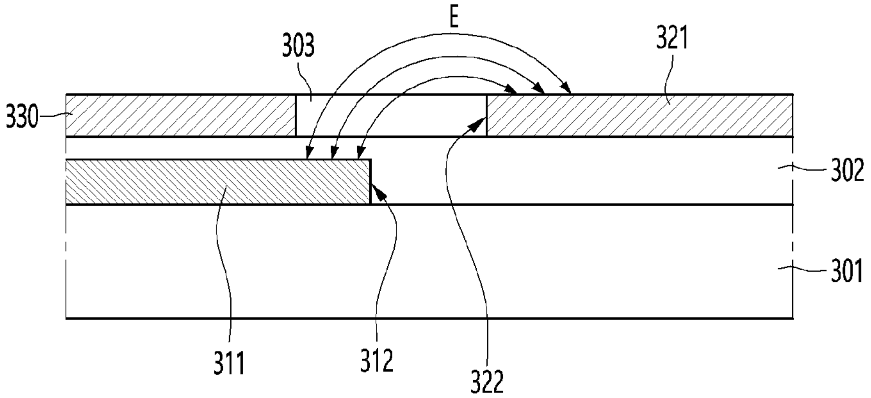
FIG. 14 shows a distribution of a electric field when the pad is provided.

Meanwhile, the light emitting device 150 can be the semiconductor light emitting device 310, 320, or 330 of FIG. 14. For example, the first semiconductor light emitting device 310 can be a red light emitting device 150R, the second semiconductor light emitting device 320 can be a green light emitting device 150G, and the third semiconductor light emitting device 330 can be a blue light emitting device 150B.

Figure 6:
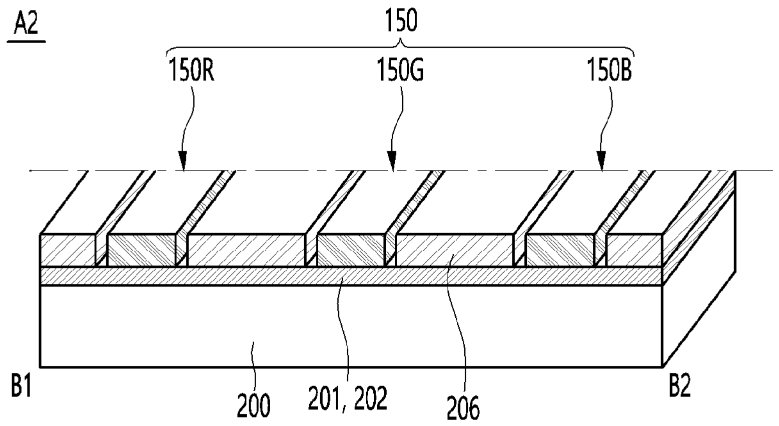
FIG. 6 is an enlarged view of area A2 in FIG. 5.

FIG. 6 is an enlarged view of area A2 in FIG. 5.

Referring to FIG. 6, the display device 100 of the embodiment can comprise a substrate 200, assembling wirings 201 and 202, an insulating layer 206, and a plurality of light emitting devices 150. More components can be comprised than these.

The assembling wiring can comprise a first assembling wiring 201 and a second assembling wiring 202 that are spaced apart from each other. The first assembling wiring 201 and the second assembling wiring 202 can be provided to generate dielectrophoresis force to assemble the light emitting device 150.

The light emitting device 150 can comprise, but may be not limited to, a red light emitting device 150, a green light emitting device 150G, and a blue light emitting device 150B0 to form a unit sub-pixel, and it is also possible to implement red and green colors by using red phosphors and green phosphors, respectively.

The substrate 200 can be formed of glass or polyimide. Additionally, the substrate 200 can comprise a flexible material such as polyethylene naphthalate (PEN) or polyethylene terephthalate (PET). Additionally, the substrate 200 can be made of a transparent material, but is not limited thereto.

The insulating layer 206 can comprise an insulating and flexible material such as polyimide, PEN, PET, etc., and can be integrated with the substrate 200 to form one substrate.

The insulating layer 206 can be a conductive adhesive layer that has adhesiveness and conductivity, and the conductive adhesive layer can be flexible and enable a flexible function of the display device. For example, the insulating layer 206 can be an anisotropic conductive film (ACF) or a conductive adhesive layer such as an anisotropic conductive medium or a solution comprising conductive particles. The conductive adhesive layer can be a layer that is electrically conductive in a direction perpendicular to the thickness, but electrically insulating in a direction horizontal to the thickness.

The insulating layer 206 can comprise an assembly hole 203 into which the light emitting device 150 is inserted. Therefore, during self-assembly, the light emitting device 150 can be easily inserted into the assembly hole 203 of the insulating layer 206. The assembly hole 203 can be called an insertion hole, a fixing hole, an alignment hole, etc.

Figure 7:
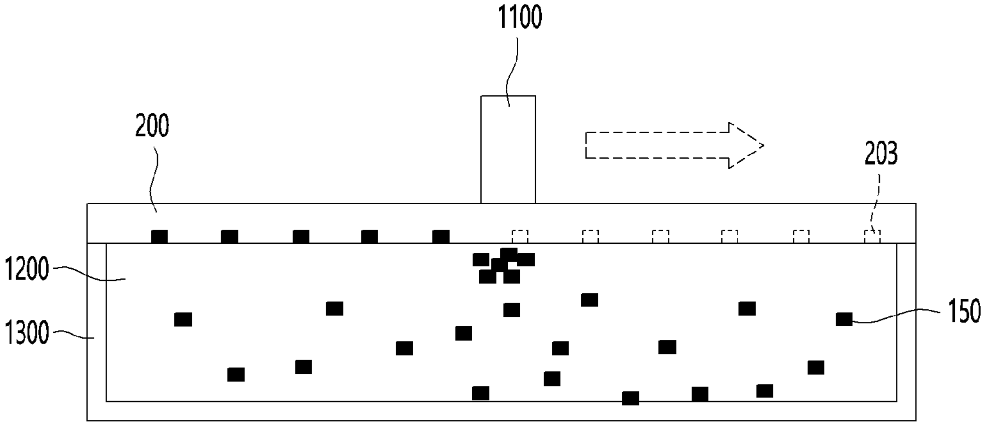
FIG. 7 is a diagram showing an example in which a light emitting device according to an embodiment is assembled on a substrate by a self-assembly method.

FIG. 7 is a diagram showing an example in which a light emitting device according to an embodiment is assembled on a substrate by a self-assembly method.

The self-assembly method of the light emitting device will be described with reference to FIGS. 6 and 7.

The substrate 200 can be a panel substrate of a display device. In the following description, the substrate 200 will be described as a panel substrate of a display device, but the embodiment is not limited thereto.

The substrate 200 can be formed of glass or polyimide. Additionally, the substrate 200 can comprise a flexible material such as PEN or PET. Additionally, the substrate 200 can be made of a transparent material, but is not limited thereto.

Referring to FIG. 7, the light emitting device 150 can be inserted into the chamber 1300 filled with the fluid 1200. The fluid 1200 can be water such as ultrapure water, but is not limited thereto. The chamber can be called a water tank, container, vessel, etc.

Thereafter, the substrate 200 can be disposed on the chamber 1300. Depending on the embodiment, the substrate 200 can be input into the chamber 1300.

As shown in FIG. 6, a pair of assembling wirings 201 and 202 corresponding to each of the light emitting devices 150 to be assembled can be disposed on the substrate 200.

The assembling wirings 201 and 202 can be formed of transparent electrodes (ITO) or can comprise a metal material with excellent electrical conductivity. For example, the assembling wirings 201 and 202 can be formed of at least one of titanium (Ti), chromium (Cr), nickel (Ni), aluminum (Al), platinum (Pt), gold (Au), tungsten (W), and molybdenum (Mo) or an alloy thereof.

An electric field can be formed in the assembling wirings 201 and 202 by an externally-supplied voltage, and a dielectrophoresis force can be formed between the assembling wirings 201 and 202 by the electric field. The light emitting device 150 can be fixed to the assembly hole 203 on the substrate 200 by this dielectrophoresis force.

The gap between the assembly wirings 201 and 202 can be formed to be smaller than the width of the light emitting device 150 and the width of the assembly hole 203, so that that the assembly position of the light emitting device 150 using an electric field can be fixed more precisely.

An insulating layer 206 can be formed on the assembling wirings 201 and 202 to protect the assembling wirings 201 and 202 from the fluid 1200 and prevent leakage of current flowing through the assembling wirings 201 and 202. The insulating layer 206 can be formed as a single layer or multilayer of an inorganic insulator such as silica or alumina or an organic insulator.

Additionally, the insulating layer 206 can comprise an insulating and flexible material such as polyimide, PEN, PET, etc., and can be integrated with the substrate 200 to form one substrate.

The insulating layer 206 can be an adhesive insulating layer or a conductive adhesive layer with conductivity. The insulating layer 206 can be flexible and can enable flexible functions of the display device.

The insulating layer 206 has a barrier rib, and the assembly hole 203 can be formed by this barrier rib. For example, when forming the substrate 200, a portion of the insulating layer 206 can be removed, so that that each of the light emitting devices 150 can be assembled into an assembly hole 203 of the insulating layer 206.

The assembly hole 203 in which the light emitting devices 150 are coupled can be formed in the substrate 200, and the surface where the assembly hole 203 is formed can be in contact with the fluid 1200. The assembly hole 203 can guide the exact assembly position of the light emitting device 150.

Meanwhile, the assembly hole 203 can have a shape and size corresponding to the shape of the light emitting device 150 to be assembled at the corresponding position. Accordingly, it is possible to prevent another light emitting device from being assembled in the assembly hole 203 or a plurality of light emitting devices from being assembled in the assembly hole 203.

Referring again to FIG. 7, after the substrate 200 is disposed, the assembly device 1100 comprising a magnetic material can move along the substrate 200. For example, a magnet or electromagnet can be used as a magnetic material. The assembly device 1100 can move while in contact with the substrate 200 in order to maximize the area to which the magnetic field is applied within the fluid 1200. Depending on the embodiment, the assembly device 1100 can comprise a plurality of magnetic materials or a magnetic material of a size corresponding to that of the substrate 200. In this instance, the moving distance of the assembly device 1100 can be limited to within a predetermined range.

By the magnetic field generated by the assembly device 1100, the light emitting device 150 in the chamber 1300 can move toward the assembly device 1100.

While moving toward the assembly device 1100, the light emitting device 150 can enter the assembly hole 203 and come into contact with the substrate 200.

At this time, by the electric field applied by the assembly wiring 201 and 202 formed on the substrate 200, the light emitting element 150 in contact with the substrate 200 can be prevented from being separated by movement of the assembly device 1100.

In other words, the time required for each of the light emitting devices 150 to be assembled on the substrate 200 can be drastically shortened by the self-assembly method using the electromagnetic field described above, so that that large-area and high-pixel display can be implemented more quickly and economically.

A predetermined solder layer 225 can be further formed between the light emitting device 150 and the second pad electrode 222 assembled on the assembly hole 203 of the substrate 200 to improve the bonding force of the light emitting device 150.

Thereafter, the first pad electrode 221 can be connected to the light emitting device 150 and power can be applied to the light emitting device 150.

Next, the molding layer 230 can be formed on the barrier rib 200S and the assembly hole 203 of the substrate 200. The molding layer 230 can be transparent resin or resin comprising a reflective material or a scattering material.

Figure 8:
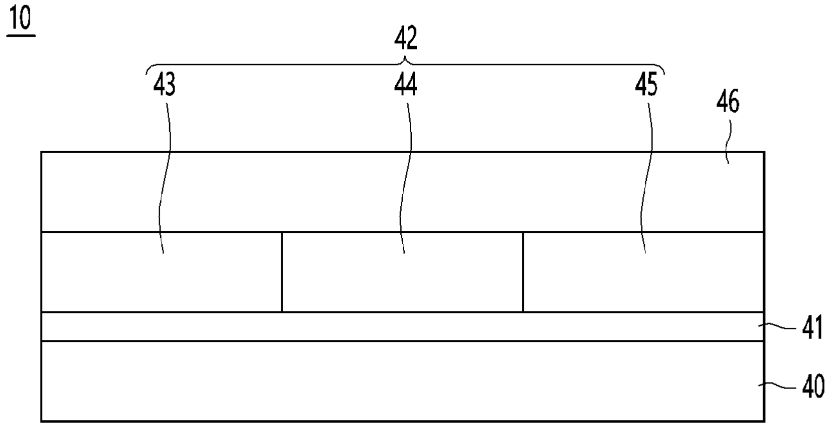
FIG. 8 is a cross-sectional view schematically showing the display panel of FIG. 2.

FIG. 8 is a cross-sectional view schematically showing the display panel of FIG. 2.

Referring to FIG. 8, the display panel 10 of the embodiment can comprise a first substrate 40, a light emitting part 41, a color generator 42, and a second substrate 46. The display panel 10 of the embodiment can comprise more components than these, but is not limited thereto. The first substrate 40 can be the substrate 200 shown in FIG. 6.

Although not shown, at least one insulating layer can be disposed between the first substrate 40 and the light emitting part 41, between the light emitting part 41 and the color generator 42, and/or between the color generator 42 and the second substrate 46, but is not limited thereto.

The first substrate 40 can support the light emitting part 41, the color generator 42, and the second substrate 46. The first substrate 40 can comprise various components as described above, such as the data lines (D1 to Dm, m is an integer of 2 or more), the scan lines S1 to Sn, the high potential voltage line, the low potential voltage line as shown in FIG. 2, a plurality of transistors ST and DT and at least one capacitor Cst as shown in FIG. 3, the first pad electrode 210 and the second pad 220 as shown in FIG. 4.

The first substrate 40 can be formed of glass or a flexible material, but is not limited thereto.

The light emitting part 41 can provide light to the color generator 42. The light emitting part 41 can comprise a plurality of light sources that emit light by themselves by applying electricity. For example, the light source can comprise a light emitting device (150 in FIGS. 5, 310, 320, and 330 in FIG. 14).

As an example, the plurality of light emitting devices 150 can be disposed separately for each sub-pixel of the pixel and can emit light independently by controlling each sub-pixel.

As another example, the plurality of light emitting devices 150 can be disposed regardless of pixel division and emit light simultaneously from all sub-pixels.

The light emitting device 150 of the embodiment can emit blue light, but is not limited thereto. For example, the light emitting device 150 of the embodiment can emit white light or purple light.

Meanwhile, the light emitting device 150 can emit red light, green light, and blue light for each sub-pixel. For this purpose, for example, a red light emitting device that emits red light can be disposed in the first sub-pixel, that is, the red sub-pixel, a green light emitting device that emits green light can be disposed in the second sub-pixel, that is, the green sub-pixel, a blue light emitting device that emits blue light can be disposed in the third sub-pixel, that is, the blue sub-pixel.

For example, each of the red light emitting device, the green light emitting device, and the blue light emitting device can comprise the group II-IV element or the group III-V compound, but is not limited thereto. For example, the group III-V compound can be selected from the group consisting of: a binary compound selected from the group consisting of GaN, GaP, GaAs, GaSb, AlN, AlP, AlAs, AlSb, InN, InP, InAs, InSb, and the mixture thereof: a ternary compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP, and mixtures thereof; and a quaternary compound selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the mixture thereof.

The color generator 42 can generate color light that is different from the light provided from the light emitter 41.

For example, the color generator 42 can comprise a first color generator 43, a second color generator 44, and a third color generator 45. The first color generator 43 can correspond to the first sub-pixel PX1 of the pixel, the second color generator 44 can correspond to the second sub-pixel PX2 of the pixel, and the third color generator 45 can correspond to the third sub-pixel PX3 of the pixel.

The first color generator 43 can generate the first color light based on the light provided from the light emitting part 41, the second color generator 44 can generate the second color light based on the light provided from the light emitting part 41, and the third color generator 45 can generate the third color light based on the light provided from the light emitter 41. For example, the first color generator 43 can output the blue light of the light emitter 41 as red light, the second color generator 44 can output the blue light of the light emitter 41 as green light, and the third color generator 45 can output the blue light of the light emitter 41 as it is.

As an example, the first color generator 43 can comprise a first color filter, the second color generator 44 can comprise a second color filter, and the third color generator 45 can comprise a first color filter.

The first color filter, the second color filter, and the third color filter can be formed of a transparent material that allows light to pass through.

For example, at least one of the first color filter, the second color filter, and the third color filter can comprise quantum dots.

The quantum dots of the example can be selected from group II-IV elements, group III-V compounds, group IV-VI compounds, group IV elements, group IV elements, and combinations thereof.

The group II-VI compound can be selected from the group consisting of a binary compound selected from the group consisting of CdSe, CdTe, ZnS, ZnSe, ZnTe, ZnO, HgS, HgSe, HgTe, MgSe, MgS, and the mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and the mixture thereof.

For example, the group III-V compound can be selected from the group consisting of: a binary compound selected from the group consisting of GaN, GaP, GaAs, GaSb, AlN, AlP, AlAs, AlSb, InN, InP, InAs, InSb, and the mixture thereof: a ternary compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP, and the mixture thereof; and a quaternary compound selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the mixture thereof.

The group IV-VI compound can be selected from the group consisting of: a binary compound selected from the group consisting of SnS, SnSe, SnTe, PbS, PbSe, PbTe, and the mixture thereof: a ternary compound selected from the group consisting of SnSeS, SnSeTe SnSTe, PbSeS, PbSeTe, PbSTe, SnPbS, SnPbSe, SnPbTe, and the mixture thereof; and a quaternary compound selected from the group consisting of SnPbSSe, SnPbSeTe, SnPbSTe, and the mixture thereof.

The group IV element can be selected from the group consisting of Si, Ge, and mixtures thereof. The group IV element can be a binary compound selected from the group consisting of SiC, SiGe, and mixtures thereof.

These quantum dots can have a full width of half maximum (FWHM) of the emission wavelength spectrum of approximately 45 nm or less, and light emitted through the quantum dots can be emitted in all directions. Accordingly, the viewing angle of the light emitting display device can be improved.

On the other hand, the quantum dots can have the form of nanoparticles, nanotubes, nanowires, nanofibers, nanoplate-shaped particles, etc. having spherical, pyramidal, multi-arm, or cubic shape, but is not limited to thereto.

For example, when the light emitting device 150 emits blue light, the first color filter can comprise red quantum dots, and the second color filter can comprise green quantum dots. The third color filter may not comprise quantum dots, but is not limited thereto. For example, the blue light from the light emitting device 150 can be absorbed by the first color filter, and the absorbed blue light can be wavelength shifted by the red quantum dots to output red light. For example, blue light from the light emitting device 150 can be absorbed by the second color filter, and the absorbed blue light can be wavelength shifted by the green quantum dots to output green light. For example, blue light from the foot and device can be absorbed by the third color filter, and the absorbed blue light can be emitted as is.

Meanwhile, when the light emitting device 150 emits white light, not only the first color filter and the second color filter but also the third color filter can comprise quantum dots. That is, the white light of the light emitting device 150 can be wavelength shifted to blue light by the quantum dots comprised in the third color filter.

For example, at least one of the first color filter, the second color filter, and the third color filter can comprise a phosphor. For example, some of the first color filters, second color filters, and third color filters can comprise quantum dots, and other color filters can comprise phosphors. For example, each of the first color filter and the second color filter can comprise a phosphor and a quantum dot. For example, at least one of the first color filter, the second color filter, and the third color filter can comprise scattering particles. Since the blue light incident on each of the first color filter, the second color filter, and the third color filter is scattered by the scattering particles and the scattered blue light is color shifted by the corresponding quantum dot, light output efficiency can be improved.

As another example, the first color generator 43 can comprise a first color conversion layer and a first color filter. The second color generator 44 can comprise a second color converter and a second color filter. The third color generator 45 can comprise a third color conversion layer and a third color filter. Each of the first color conversion layer, the second color conversion layer, and the third color conversion layer can be disposed adjacent to the light emitting part 41. The first color filter, second color filter, and third color filter can be disposed adjacent to the second substrate 46.

For example, the first color filter can be disposed between the first color conversion layer and the second substrate 46. For example, the second color filter can be disposed between the second color conversion layer and the second substrate 46. For example, the third color filter can be disposed between the third color conversion layer and the second substrate 46.

For example, the first color filter can be in contact with the upper surface of the first color conversion layer and have the same size as the first color conversion layer, but is not limited thereto. For example, the second color filter can be in contact with the upper surface of the second color conversion layer and can have the same size as the second color conversion layer, but is not limited thereto. For example, the third color filter can be in contact with the upper surface of the third color conversion layer and can have the same size as the third color conversion layer, but is not limited thereto.

For example, the first color conversion layer can comprise red quantum dots, and the second color conversion layer can comprise green quantum dots. The third color conversion layer may not comprise quantum dots. For example, the first color filter can comprise a red-based material that selectively transmits red light converted in the first color conversion layer, the second color filter can comprise a green material that selectively transmits green light converted in the second color conversion layer, and the third color filter can comprise a blue-based material that selectively transmits blue light transmitted as it is through the third color conversion layer.

Meanwhile, when the light emitting device 150 emits white light, not only the first color conversion layer and the second color conversion layer but also the third color conversion layer can comprise quantum dots. That is, the white light of the light emitting device 150 can be wavelength shifted to blue light by the quantum dots comprised in the third color filter.

Referring again to FIG. 8, the second substrate 46 can be disposed on the color generator 42 to protect the color generator 42. The second substrate 46 can be formed of glass, but is not limited thereto.

The second substrate 46 can be called a cover window, cover glass, etc.

The second substrate 46 can be formed of glass or a flexible material, but is not limited thereto.

Meanwhile, in the embodiment, by disposing the first and second wirings to be offset from each other, stable arrangement of assembling wirings is possible even though the size of the pixel is reduced to implement high resolution. That is, the first wiring and the second wiring can be disposed on different layers, but the first wiring and the second wiring may not overlap vertically. For example, an insulating layer can be disposed between the first wiring and the second wiring, and the second wiring can be disposed on the insulating layer, so that that the first wiring and the second wiring can be electrically insulated by the insulating layer. The insulating layer can be a dielectric layer made of dielectric material.

Figure 12:
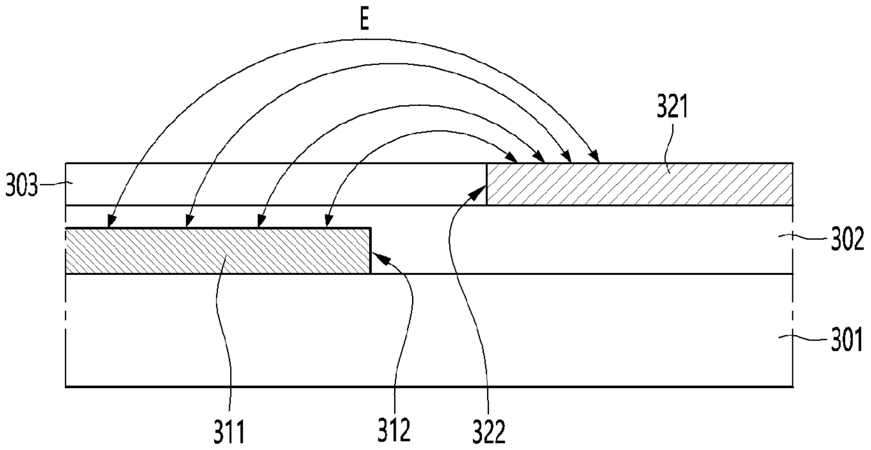
FIG. 12 shows a distribution of an electric field when no pad is provided.
Figure 13:
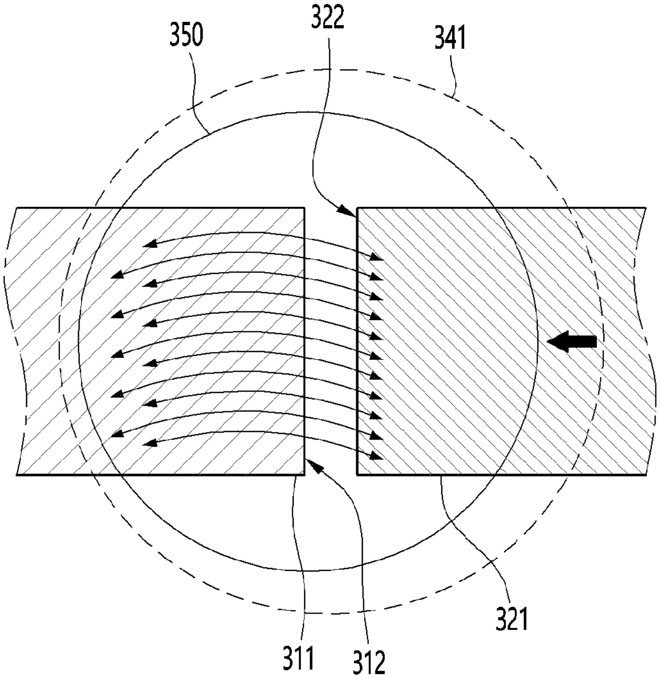
FIG. 13 shows a semiconductor light emitting device being shifted to one side within an assembly hole.

However, when the first and second wirings are disposed to be offset and an electric field is formed between the first and second wirings, the electric field can be concentratedly distributed on the first wiring disposed below the second wiring (FIG. 12), and as a result, the dielectrophoresis force can be concentrated on the first wiring, so that that the semiconductor light emitting device within the assembly hole can be biased toward the first wiring rather than the center of the assembly hole (FIG. 13). In this instance, the contact area of the lower surface of the semiconductor light emitting device with the second wiring can be reduced or no longer comes into contact, which can cause various problems.

For example, as the contact area of the semiconductor light emitting device with the second wiring decreases, the semiconductor light emitting device may be not stably bonded to the second wiring, and the semiconductor light emitting device can be separated from the assembly hole.

For example, as the contact area of the semiconductor light emitting device with the second wiring decreases, the electrical signal are not smoothly supplied to the semiconductor light emitting device through the second wiring, thereby reducing the light efficiency of the semiconductor light emitting device. Accordingly, the luminance of a pixel equipped with a semiconductor light emitting device can decrease. In particular, when the semiconductor light emitting device is not in contact with the second wiring, the electrical signal are not supplied to the semiconductor light emitting device through the second wiring, so that the semiconductor light emitting device does not emit light. Therefore, a lighting defect in which some pixels do not light up can occur in the display device.

Meanwhile, the degree of bias of the semiconductor light emitting device can be different for each assembly hole of each pixel, which may cause luminance deviation, that is, luminance non-uniformity, between each pixel. In particular, in order to achieve high image quality in display devices, it is very important to ensure luminance uniformity between each pixel.

Figure 18:
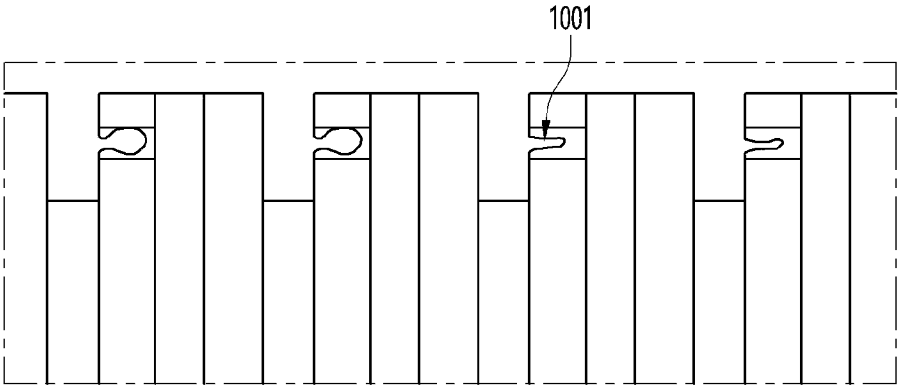
FIG. 18 shows a semiconductor light emitting device emitting light when no pad is provided.

As shown in FIG. 18, the luminance distribution 1000 in each pixel may be not constant, and the semiconductor light emitting device in some pixels may not emit light, so that luminance may not exist.

To solve these various problems, in the embodiment, the pad can be disposed on the same layer as the second wiring. The pad can overlap the first wiring disposed on a different layer from the second wiring.

Figure 15:
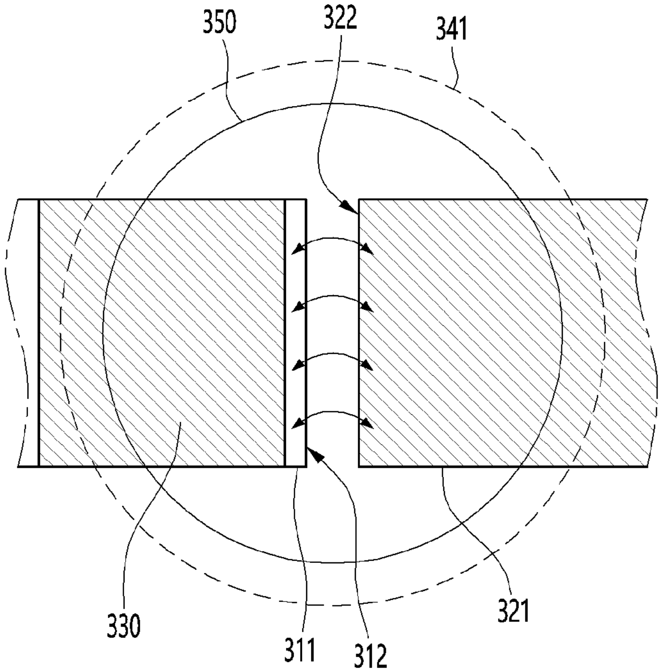
FIG. 15 shows a semiconductor light emitting device being assembled in position within an assembly hole.

For example, it can overlap with a portion of the first wiring of the pad. Therefore, during self-assembly, an electric field can be limitedly formed only between the first and second wirings that do not overlap the pad. That is, when a pad is not provided, an electric field can be formed across the entire first wiring, whereas when a pad is provided, an electric field can be formed only in a portion of the first wiring that does not overlap the pad, so that the concentration of the electric field can be alleviated (FIG. 14). In this way, the embodiment can alleviate the distribution of the electric field concentrated on the first wiring, so that that the semiconductor light emitting device can be positioned in the correct position within the assembly hole, that is, at the center of the assembly hole (FIG. 15). In this way, by positioning the semiconductor light emitting device at the center of the assembly hole, the contact area between the semiconductor light emitting device and the second wiring can be increased. Accordingly, the semiconductor light emitting device can be more strongly bonded to the second wiring, thereby preventing the semiconductor light emitting device from being separated. In addition, the electrical signal can be more smoothly supplied to the semiconductor light emitting device through the second wiring, thereby improving the optical efficiency of the semiconductor light emitting device and implementing high luminance. In particular, when the pad is electrically connected to the second wiring after self-assembly, the electrical signal can be supplied not only through the second wiring but also through the pad, allowing current to flow in a wider area of the semiconductor light emitting device, thereby significantly improving light efficiency. More improved high resolution can be achieved. In addition, since the semiconductor light emitting device in each pixel is positioned at the center of the assembly hole, uniform luminance can be secured without luminance deviation between each pixel, improving image quality and improving product reliability.

Figure 19:
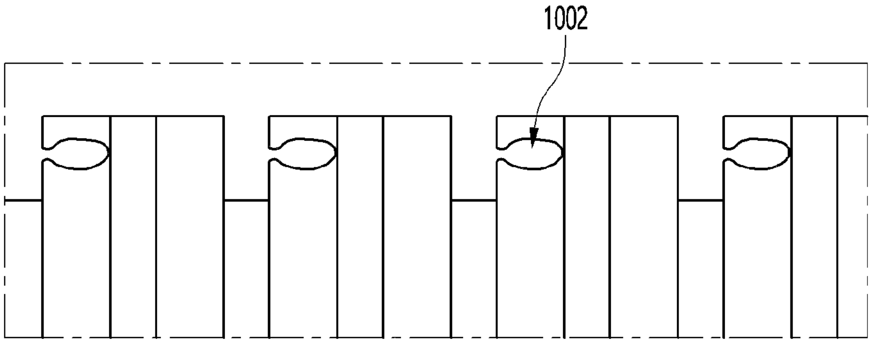
FIG. 19 shows a semiconductor light emitting device emitting light when a pad is provided.

As shown in FIG. 19, light with a uniform luminance distribution 1002 can be emitted from all pixels.

Hereinafter, various embodiments will be described with reference to the drawings.

First Embodiment

Figure 9:
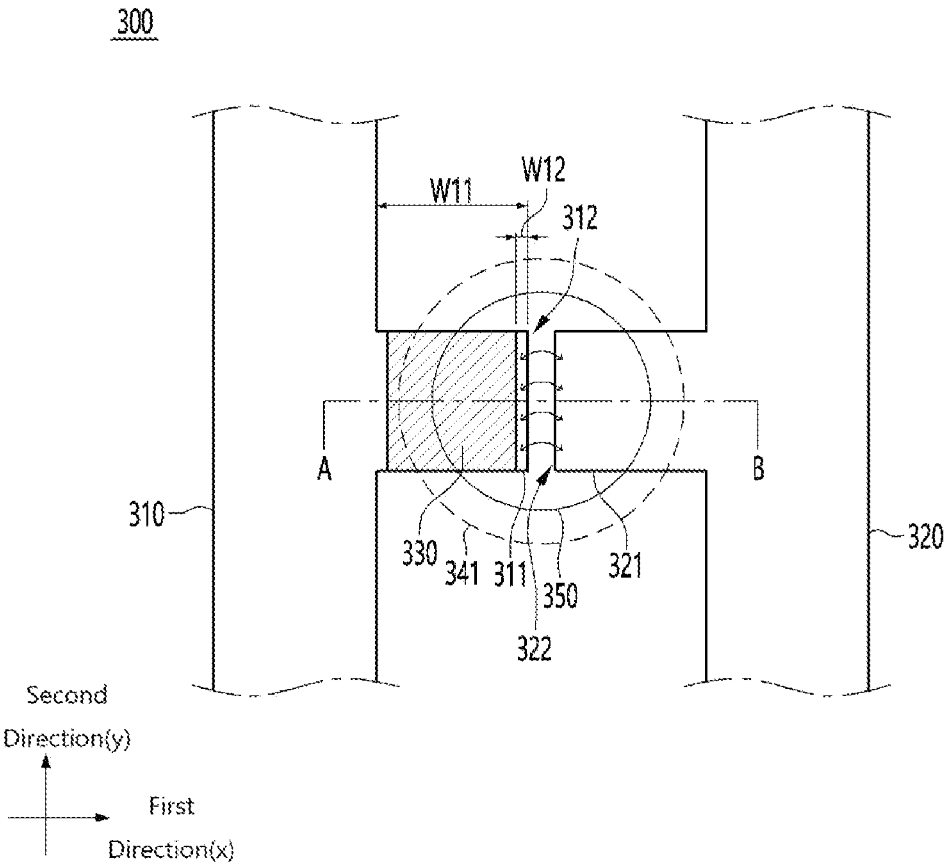
FIG. 9 is a plan view showing a display device according to a first embodiment.

FIG. 9 is a plan view showing a display device according to a first embodiment.

Referring to FIG. 9, the display device 300 according to the first embodiment can comprise a first wiring 310, a second wiring 320, a pad 330, and a semiconductor light emitting device 350.

In the embodiment, the first wiring 310 and the second wiring 320 can be disposed in different layers. For example, the first wiring 310 can be a lower layer, and the second wiring 320 can be an upper layer. For example, the first wiring 310 and the second wiring 320 may not overlap each other. Since the first wiring 310 and the second wiring 320 are disposed on different layers, the first wiring 310 and the second wiring 320 are not short-circuited even if they are adjacent to each other. A high-resolution display can be implemented by minimizing the arrangement gap between the first wiring 310 and the second wiring 320.

In the embodiment, the pad 330 can be disposed on the same layer as the second wiring 320 and spaced apart from the second wiring 320.

For example, the pad 330 can vertically overlap the first wiring 310. When viewed from above, the pad 330 can cover a portion of the first wiring 310. For example, a portion of the first wiring 310 adjacent to the second wiring 320 may be not covered by the pad 330. In this instance, during self-assembly, an electric field may be not formed between the second wiring 320 and another portion of the first wiring 310 covered by the pad 330. An electric field can be formed between the second wiring 320 and a portion of the first wiring 310 that may be not covered by the pad 330. Accordingly, the concentration of the electric field on the first wiring 310 can be alleviated when the pad 330 is provided compared to when the pad 330 is not provided, and due to this alleviated electric field, the semiconductor light emitting device 350 can be positioned at the midpoint between the first wiring 310 and the second wiring 320. For example, when the assembly hole 341 is formed to cover the first wiring 310 and the second wiring 320, the semiconductor light emitting device 350 can be formed within the assembly hole 341 to cover the pad 330 and the second wiring 320. At this time, the semiconductor light emitting device 350 can be positioned at the center of the assembly hole 341.

As shown in FIG. 9, when the first extension part 311 and the second extension part 321 are provided, an assembly hole can be formed to cover the first extension part 311 and the second extension part 321. In this instance, the semiconductor light emitting device 350 can be disposed on the pad 330 and the second extension part 321 within the assembly hole 341.

The extension part can be called a protrusion, a protrusion part, etc.

The first extension part 311 can extend toward the second wiring 320 along the first direction (x-axis direction), and the second extension part 321 can extend toward the first wiring 310 along a direction (−x-axis direction) opposite to the first direction (x-axis direction).

The pad 330 can vertically overlap the first extension part 311. The semiconductor light emitting device 350 can be disposed on the pad 330 and the second extension part 321 within the assembly hole 341.

A portion of the first extension part 311 can be covered by the pad 330. In this instance, during self-assembly, an electric field may be not formed between a portion of the first extension part 311 and the second extension part 321 due to the pad 330, and an electric field can be formed between the second extension part 321 and another portion of the first extension part 311 that is not covered by the pad 330. Accordingly, the concentration of the electric field on the first extension part 311 can be alleviated when the pad 330 is provided compared to when the pad 330 is not provided, and due to this alleviated electric field, the semiconductor light emitting device 350 can be positioned at the midpoint between the first extension part 311 and the second extension part 321. For example, when the assembly hole 341 is formed to cover the first extension part 311 and the second extension part 321, the semiconductor light emitting device 350 can be disposed on the pad 330 and the second extension part within the assembly hole 341. At this time, the semiconductor light emitting device 350 can be positioned at the center of the assembly hole 341.

According to the embodiment, by preventing an electric field from being formed between the first wiring 310 or a portion of the first extension part 311 and the second wiring 320 or the second extension part 321 by the pad 330, the distribution of electric fields concentrated on the first wiring 310 or the first extension part 311 can be alleviated. Accordingly, the semiconductor light emitting device 350 can be positioned at the center of the assembly hole 341 to strengthen the bonding force to prevent the semiconductor light emitting device 350 from being separated, a high-brightness display can be implemented by increasing the contact area between the semiconductor light emitting device 350 and the second wiring 320, and image quality can be improved by eliminating luminance deviation between each pixel. In particular, when the pad 330 and the second wiring 320 or the second extension part 321 are electrically connected after self-assembly, the electrical signal can be supplied to the semiconductor light emitting device 350 from more various positions, thereby further improving light efficiency.

Figure 20:
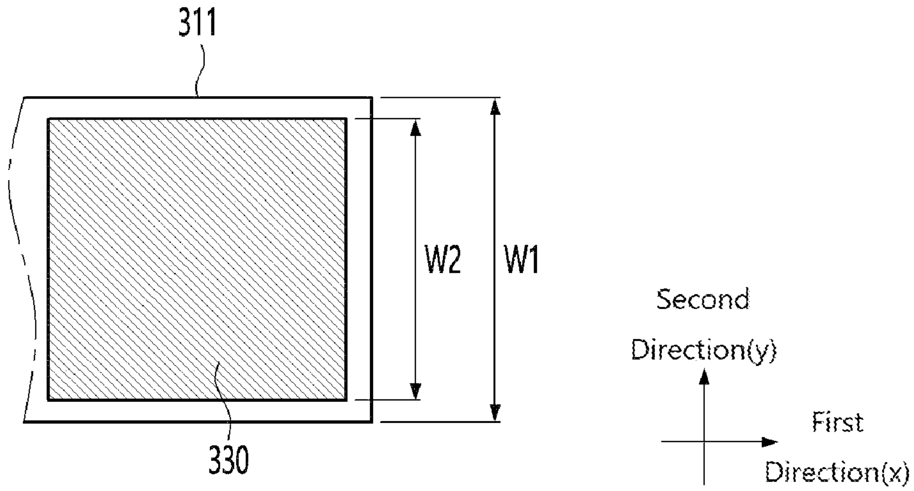
FIG. 20 shows the arrangement relationship between the first extension part and the pad.

As shown in FIG. 20, the pad 330 can cover a portion of the first extension part 311. That is, the pad 330 may not cover the edge area of the first extension part 311. The width W2 of the pad 330 along the second direction (y-axis direction) can be less than or equal to the width W1 of the first extension part 311 along the second direction (y-axis direction).

For example, the width W1 of the first extension part 311 and the width W2 of the pad 330 can be the same. In this instance, the first extension part 311 can be completely covered by the pad 330 along the second direction (y-axis direction).

As another example, the width W2 of the pad 330 can be smaller than the width W1 of the first extension part 311. In this instance, a portion of the first extension part 311 along the second direction (y-axis direction) can be covered by the pad 330 and another portion of the first extension part 311 may be not covered by the pad 330.

As shown in FIG. 20, a portion of the first extension part 311 along the first direction (x-axis direction) can be covered by the pad 330, and another portion of the first extension part 311 may be not covered by the pad 330. For example, another portion of the first extension part 311 adjacent to the second end 322 of the second extension part 321 may be not covered by the pad 330.

During self-assembly, since an electric field is not formed for the portion of the first extension part 311 covered by the pad 330, and an electric field is formed between the second extension part 321 and another part of the first extension part 311 that is not covered by the pad 330, the distribution of the electric field concentrated on the first extension part 311 can be alleviated compared to when the pad 330 is not provided.

Figure 10:
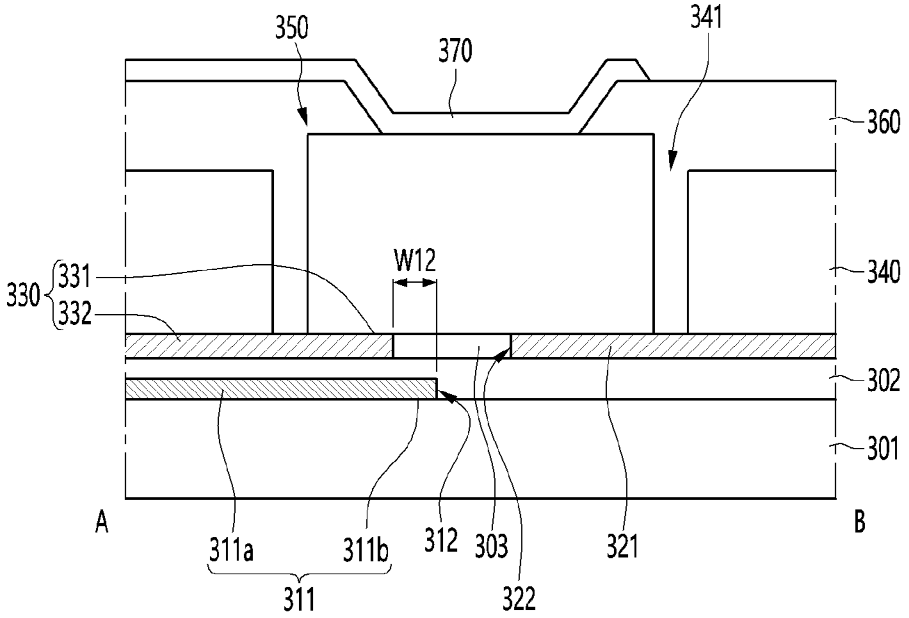
FIG. 10 is a cross-sectional view showing a display device according to a first embodiment.
Figure 11:
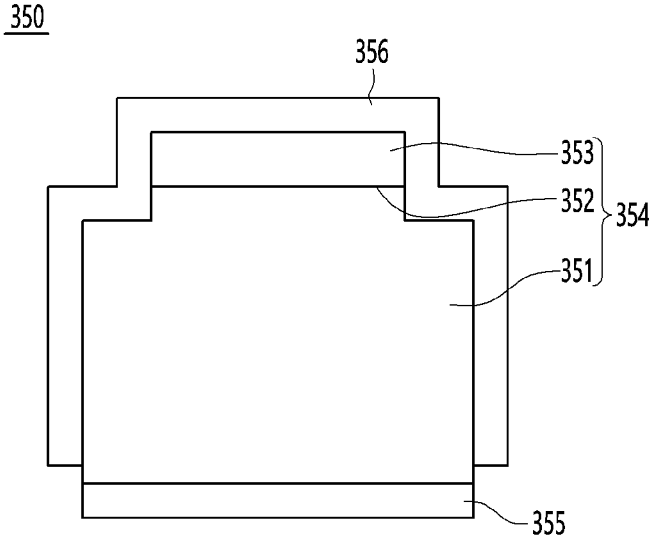
FIG. 11 is a cross-sectional view showing the semiconductor light emitting device of a first embodiment.
Figure 17:
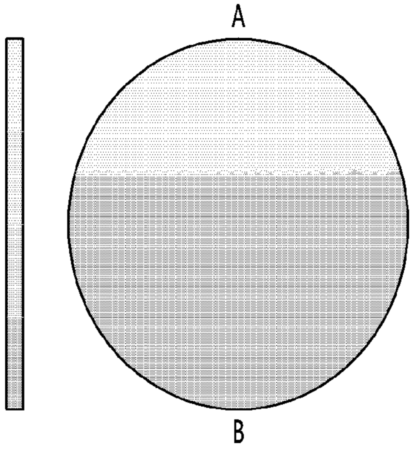
FIG. 17 shows a distribution of dielectrophoresis force when no pad is provided and when the pad is moved away from the end of a first extension part.
Figure 17:
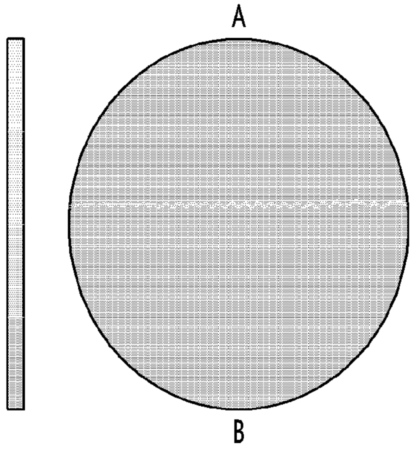
Figure 17:
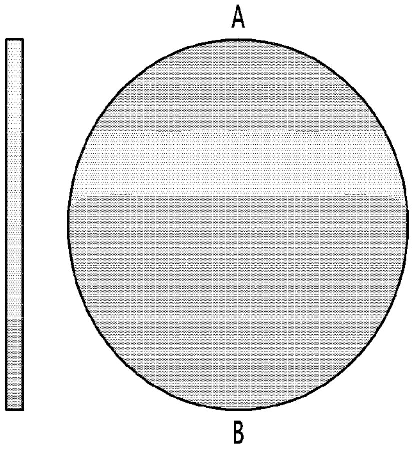
Figure 17:
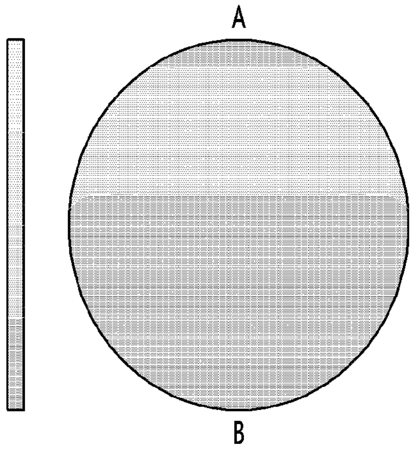

As shown in FIGS. 9, 10, and 17A, when the pad 330 is not provided, the electric field can be concentrated on the first extension part 311, and in this instance, the semiconductor light emitting device 350 can be assembled biased toward the first extension part 311 within the assembly hole 341.

As shown in FIGS. 9, 10, and 17*b* to 17*d*, it can be seen that the electric field concentrated on the first extension part 311 is alleviated as the pad 330 is provided.

FIG. 17*b* shows the electric field distribution when one end of the pad 330 coincides with the first end 312 of the first extension part 311. FIG. 17C shows the electric field distribution when one end of the pad 330 is moved toward the first wiring 310 by as much as a from the first end 312 of the first extension part 311. In this instance, the pad 330 may not overlap the first extension part 311 by as much as a. FIG. 17D shows the electric field distribution when one end of the pad 330 is moved toward the first wiring 310 by b from the first end 312 of the first extension part 311. In this instance, b is greater than a and the pad 330 may not overlap the first extension part 311 by as much as much as b.

As shown in FIGS. 9, 10, and 17*b* to 17*d*, it can be seen that the concentration of the electric field on the first extension part 311 is alleviated in FIG. 17*d* than in FIG. 17*a*. It can be seen that the concentration of the electric field on the first extension part 311 is alleviated in FIG. 17C than in FIG. 17D. It can be seen that the concentration of the electric field on the first extension part 311 is alleviated in FIG. 17B compared to FIG. 17C. That is, the concentration of the electric field in FIG. 17*b* can be most alleviated. If the concentration of the electric field on the first extension part 311 is too alleviated, the semiconductor light emitting device 350 may be not assembled in the assembly hole 341. Accordingly, the embodiment can be optimized except for FIGS. 17A and 17B. That is, as shown in FIG. 10, optimization can be achieved by adjusting the width of the second extension area 311*b* that does not overlap the pad 330.

One end of the pad 330 can be moved toward the first wiring 310 by as much as a or b from the first end 312 of the first extension part 311, so that that the pad 330 may not overlap the first extension part 311 by as much as a or b.

Meanwhile, the first wiring 310, the second wiring 320, and the pad 330 can be made of metal with excellent electrical conductivity. For example, the first wiring 310, the second wiring 320, and the pad 330 can be made of the same type of metal. For example, the first wiring 310, the second wiring 320, and the pad 330 can have a single-layer or multi-layer structure. For example, the first wiring 310, the second wiring 320, and the pad 330 can have a multilayer structure of Mo/Al/Mo, but are not limited thereto. Al can be an electrode wiring, and Mo can be an oxidation prevention film.

For example, the second wiring 320 and the pad 330 can be made of the same type of metal.

FIG. 10 is a cross-sectional view showing a display device according to a first embodiment.

Referring to FIGS. 9 and 10, the display device 300 according to the first embodiment can comprise a substrate 301, first and second dielectric layers 302 and 303, and first and second extension parts 311 and 321, first and second insulating layers 340 and 360, a semiconductor light emitting device 350, and an upper wiring electrode 370. The display device 300 according to the first embodiment can comprise more components than these, but is not limited thereto. In addition, the display device 300 according to the first embodiment shown in FIG. 9 is only an example, and various modifications in structure, shape, and/or technology are possible.

The substrate 301 can be formed of a material having rigid characteristics or flexible characteristics. For example, the substrate 301 can be made of glass or polyimide. Additionally, the substrate 301 can comprise a flexible material such as PEN or PET. Additionally, the substrate 301 can be made of a transparent material, but is not limited thereto. In addition, the substrate 301 can be formed of a material with excellent insulating properties.

The first extension part 311 and the first wiring 310 can be disposed on the substrate 301. For example, the first extension part 311 can be a portion of the first wiring 310. For example, the first extension part 311 can extend toward the second wiring 320 along the first direction (x-axis direction).

For example, the first extension part 311 can be disposed on the same surface of the substrate 301 as the first wiring 310. For example, the first extension part 311 and the first wiring 310 can be formed on the substrate 301 using a photolithography process.

The first dielectric layer 302 can be disposed on the first extension part 311 and the first wiring 310. For example, the first dielectric layer 302 can be disposed on the entire area of the substrate 301, but is not limited thereto. For example, the upper surface of the first dielectric layer 302 can have a flat surface.

The second extension part 321, the second wiring 320, and the pad 330 can be disposed on the first dielectric layer 302. For example, the second extension part 321 can be portion of the second wiring 320. For example, the second extension part 321 can extend toward the first wiring 310 along a direction (−x-axis direction) opposite to the first direction (x-axis direction).

For example, the second extension part 321 can be disposed on the same surface of the first dielectric layer 302 as the pad 330 and the second wiring 320. For example, the second extension part 321, the second wiring 320, and the pad 330 can be formed on the substrate 301 using a photolithography process.

For example, the first extension part 311 can be disposed on the first region of the first dielectric layer 302, and the pad 330 can be disposed on the second region of the first dielectric layer 302. The first region and the second region of the first dielectric layer 302 can be physically spaced apart from each other. In this instance, the second extension part 321 may not vertically overlap the first extension part 311 and the pad 330 can vertically overlap the first extension part 311.

The first wiring 310 and the second wiring 320 can be assembling wirings for assembling the semiconductor light emitting device 350. When an alternating current signal is applied to the first wiring 310 and the second wiring 320, an electric field can be generated between the first wiring 310 and the second wiring 320, and the semiconductor light emitting device 350 can be assembled in the assembly hole 341 by the dielectrophoresis force caused by the generated electric field. Likewise, the first extension part 311 and the second extension part 321 can be also assembly electrodes for assembling the semiconductor light emitting device 350.

Meanwhile, as shown in FIG. 10, since the first wiring 310 (or the first extension part 311, hereinafter described as the first extension part 311) and the second wiring 320 (or the second extension part 321, hereinafter described as the second extension part 321) may be not disposed on the same layer but is disposed offset from each other, the electric field generated between the first extension part 311 and the second extension part 321 can be concentratedly distributed on the first extension part 311 disposed below the second extension part 321. Accordingly, the dielectrophoresis force can be concentrated on the first extension part 311, so that that the semiconductor light emitting device 350 within the assembly hole 341 can be biased toward the first extension part 311 rather than the center of the assembly hole 341. In this instance, the contact area of the lower surface of the semiconductor light emitting device 350 with the second extension part 321 can be reduced or no longer comes into contact, which can cause various problems.

For example, as the contact area of the semiconductor light emitting device 350 with the second extension part 321 decreases, the semiconductor light emitting device 350 can be no longer stably bonded to the second extension part 321, so the semiconductor light emitting device 350 can be separated from the assembly hole 341.

For example, as the contact area of the semiconductor light emitting device 350 with the second extension part 321 decreases, the electrical signal may be not smoothly supplied to the semiconductor light emitting device 350 through the second extension part 321, so that the light efficiency of the semiconductor light emitting device 350 can decrease. Accordingly, the luminance of the pixel provided with the semiconductor light emitting device 350 can decrease. In particular, when the semiconductor light emitting device 350 is not in contact with the second extension part 321, the electrical signal may be not supplied to the semiconductor light emitting device 350 through the second extension part 321, so that the semiconductor light emitting device 350 does not emit light. Therefore, a lighting defect in which some pixels do not light up can occur in the display device.

Meanwhile, the degree of bias of the semiconductor light emitting device 350 can be different for each assembly hole 341 of each pixel, which can cause luminance deviation, that is, luminance non-uniformity, between each pixel. In particular, in order to obtain high image quality in a display device, it is very important to secure luminance uniformity between each pixel.

To solve these various problems, the pad 330 can be provided. The pad 330 can be an alleviation member that alleviates the dielectrophoresis force concentrated on the first extension part 311.

In the embodiment, the pad 330 can be vertically disposed to overlap the first extension part 311, so that that the pad 330 can interfere with the generation of the electric field, thereby reducing the electric field from being concentrated on the first extension part 311. Accordingly, the semiconductor light emitting device 350 can be positioned in the correct position within the assembly hole 341, that is, at the center of the assembly hole 341. In this way, by positioning the semiconductor light emitting device 350 at the center of the assembly hole 341, the contact area between the semiconductor light emitting device 350 and the second extension part 321 can be increased.

Due to the increase in the contact area, the semiconductor light emitting device 350 can be more strongly bonded to the second extension part 321, thereby preventing the semiconductor light emitting device 350 from being separated. In addition, the electrical signal can be more smoothly supplied to the semiconductor light emitting device 350 through the second extension part 321, thereby improving the optical efficiency of the semiconductor light emitting device 350 and implementing high luminance. In particular, when the pad 330 is electrically connected to the second extension part 321 after self-assembly, an electrical signal can be supplied not only through the second extension part 321 but also through the pad 330, thereby forming a semiconductor light emitting device. Thus, since the current I flows in a wider area of the semiconductor light emitting device 350, the light efficiency can be significantly improved and further improved high resolution can be achieved. In addition, since the semiconductor light emitting device 350 in each pixel is positioned at the center of the assembly hole 341, uniform luminance can be secured without luminance deviation between each pixel, improving image quality and improving product reliability.

For example, the pad 330 can comprise a first pad area 331 and a second pad area 332. The first pad area 331 can vertically overlap the assembly hole 341, and the second pad area 332 may not overlap the assembly hole 341. That is, the second pad area 332 can vertically overlap the first insulating layer 340. For example, a portion of the pad 330, i.e., the first pad area 331, can be disposed to vertically overlap the assembly hole 341, and another portion, i.e., the second pad area 332, can be disposed to vertically overlap the first insulating layer 340. At this time, the area (or size) of the first pad area 331 can be greater than the area (or size) of the second pad area 332.

Since the electric field between the first extension part 311 and the second extension part 321 is mainly generated within the assembly hole 341, the area of the first pad area 331 can be made greater than the area of the second pad area 332, so that most of the first extension part 311 positioned in the assembly hole 341 can be vertically overlapped by the second pad area 332. Accordingly, the concentration of the electric field can be alleviated on the first extension part 311 and strengthened between the first extension part 311 and the second extension part 321, so that that the semiconductor light emitting device 350 can be correctly positioned in the assembly hole 341. That is, the center of the semiconductor light emitting device 350 can be disposed to coincide with the center between the first extension part 311 and the second extension part 321. When the semiconductor light emitting device 350 is circular, a certain distance from the inner surface of the assembly hole 341 can be maintained at any point on all sides of the semiconductor light emitting device 350.

In addition, the concentration of the electric field between the first extension part 311 and the second extension part 321 can move from the center between the first extension part 311 and the second extension part 321 to the first extension part 311 or the second extension part 321 according to the degree of overlap between the first pad area 331 and the first extension part 311 within the assembly hole 341.

On the other hand, even if the pad 330 overlaps the first extension part 311, an electric field must be generated between the first extension part 311 and the second extension part 321, so that the first extension part 311 may not completely overlap due to the pad 330.

The first extension part 311 can comprise a first extension area 311*a* and a second extension area 311*b*. The first extension area can extend toward the second wiring 320 and can vertically overlap the pad 330. The second extension area can extend from the first extension area toward the second wiring 320 and may not vertically overlap the pad 330.

As shown in FIG. 9, an area around the first end 312 of the first extension part 311 adjacent to the second end 322 of the second extension part 321, that is, the second extension area 311*b* may not vertically overlap the first pad area 331 of the pad 330. Accordingly, an electric field can be generated between the second extension area 311*b* of the first extension part 311 and the second extension part 321, and an electric field may not be generated or can be weakly generated between the first extension area 311*a* of the first extension part 311 and the second extension part 321. Therefore, only the first extension area of the first extension part 311 can be vertically overlapped by the pad 330 to alleviate the concentration of the electric field on the first extension part 311, so that the semiconductor light emitting device 350 can be correctly positioned in the assembly hole 341. In addition, only the first extension area of the first extension part 311 can be vertically overlapped by the pad 330, so that that the semiconductor light emitting device 350 can be assembled in the assembly hole 341 by allowing the second extension area of the first extension part 311 to generate an electric field together with the second extension part 321.

Figure 21:
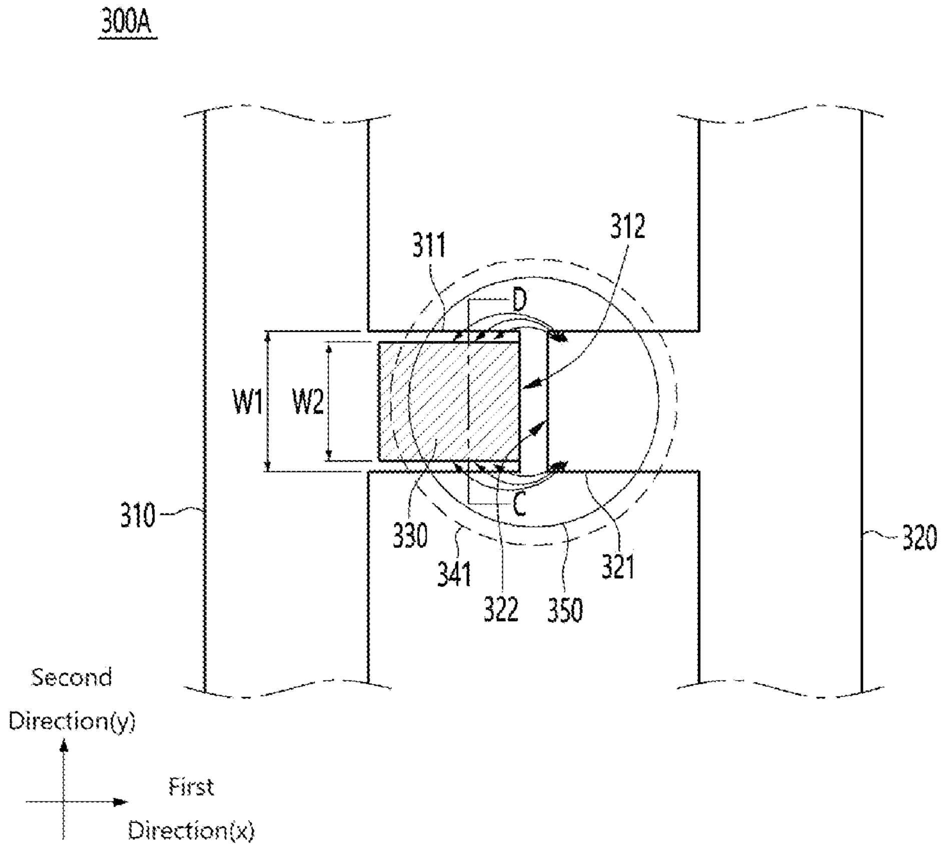
FIG. 21 is a plan view showing a display device according to a second embodiment.

For example, the width W12 of the second extension area along the first direction (x-axis direction) can be 0) to 50% of the width W11 of the first extension part 311 along the first direction (x-axis direction). The fact that the width W12 of the second extension area in the first direction (x-axis direction) is 0 means that one end of the pad 330 and the second end 322 of the second extension area are vertically coincided. As such, the electric field may not be generated or may be weakly generated between the first extension area and the second extension part 321. When the width W12 of the second extension area in the first direction (x-axis direction) is 0, as shown in FIG. 21, the width W2 of the pad 330 in the second direction (y-axis direction) can be smaller than the width W1 of the first extension part 311 in the second direction (y-axis direction), so that portions of both sides of the first extension part 311 may not be overlapped by the pad 330. In this instance, since an electric field is generated between both sides of the first extension part 311 and the second extension part 321, the semiconductor light emitting device 350 can be stably assembled in the assembly hole 341.

Meanwhile, when the width W12 of the second extension area in the first direction (x-axis direction) can exceed 50% of the width W11 of the first extension part 311 in the first direction (x-axis direction), the rate at which the electric field is concentrated on the first wiring 310 can increase, so that the semiconductor light emitting device 350 can be biased toward the first wiring 310 within the assembly hole 341.

Meanwhile, the first extension part 311, the first wiring 310, the second extension part 321, the second wiring 320, and the pad 330 can be made of metal with excellent electrical conductivity. The first extension part 311, the first wiring 310, the second extension part 321, the second wiring 320, and the pad 330 can be made of the same metal, but is not limited thereto. For example, the first extension part 311, the first wiring 310, the second extension part 321, the second wiring 320, and the pad 330 can have a three-layer structure of Mo/Al/Mo, but is not limited thereto. Al can be an electrode that supplies an electrical signal, and Mo can be an anti-corrosion layer that prevents corrosion of the electrode, but is not limited thereto.

Meanwhile, the second dielectric layer 303 can be disposed on the first dielectric layer 302. The first dielectric layer 302 can comprise a first region that vertically overlaps the second extension part 321, the second wiring 320, and the pad 330, and a second region not that vertically overlaps the second extension part 321, the second wiring 320, and the pad 330. In this instance, the second dielectric layer 303 can be disposed on the second region of the first dielectric layer 302. For example, the second dielectric layer 303 can be disposed between the second extension part 321, the second wiring 320, and the pad 330. For example, the upper surface of the second dielectric layer 303 can be horizontally coincided with the upper surface of each of the second extension part 321, the second wiring 320, and the pad 330, but is not limited thereto.

Although not shown, the first dielectric layer 302 and the second dielectric layer 303 can be formed as a single layer integrally formed.

The first insulating layer 340 can be disposed on the first extension part 311, the second wiring 320, and the pad 330. The first insulating layer 340 can comprise an assembly hole 341. A part of each of the first and second wirings 310 and 320 can be exposed through the assembly hole 341. Specifically, a portion of each of the first extension part 311 and the second extension part 321 can be exposed by the assembly hole 341.

For example, after the first insulating layer 340 is formed on the substrate 301, it is locally etched to expose the first extension part 311 and the second extension part 321 to form an assembly hole 341. The assembly hole 341 can be formed in a shape corresponding to the shape of the semiconductor light emitting device 350. For example, when the semiconductor light emitting device 350 is circular, the assembly hole 341 can also have a circular shape.

The semiconductor light emitting device 350 can be assembled in the assembly hole 341. At this time, the upper surface of the semiconductor light emitting device 350 can be positioned higher than the upper surface of the first insulating layer 340, but is not limited thereto. The semiconductor light emitting device 350 will be described in detail later.

The second insulating layer 360 can be disposed on the first insulating layer 340. The second insulating layer 360 can be disposed within the assembly hole 341. That is, the second insulating layer 360 can be disposed in the remaining space within the assembly hole 341 excluding the semiconductor light emitting device 350. The semiconductor light emitting device 350 can be completely fixed to the assembly hole 341 by the second insulating layer 360. The second insulating layer 360 can prevent external moisture or foreign substances from penetrating into the semiconductor light emitting device 350. The semiconductor light emitting device 350 can be protected from external shock by the second insulating layer 360. That is, the second insulating layer 360 can be a protective member to protect the semiconductor light emitting device 350.

Although not shown, the second insulating layer 360 may be not disposed on the first insulating layer 340 but can be disposed only in the assembly hole 341.

The first insulating layer 340 and the second insulating layer 360 can comprise an organic material, but are not limited thereto. The first insulating layer 340 and the second insulating layer 360 can be formed of the same or different materials. The first insulating layer 340 and the second insulating layer 360 can comprise an insulating and flexible material such as polyimide, PEN, PET, etc., and can be integrated with the substrate 301 to form one substrate.

The first insulating layer 340 and the second insulating layer 360 can be conductive adhesive layers that have adhesiveness and conductivity, and the conductive adhesive layer can be flexible and enable the flexible function of the display device 300. For example, the first insulating layer 340 and the second insulating layer 360 can be an anisotropic conductive film (ACF) or a conductive adhesive layer such as an anisotropic conductive medium or a solution comprising conductive particles. The conductive adhesive layer can be a layer that is electrically conductive in a direction perpendicular to the thickness, but electrically insulating in a direction horizontal to the thickness.

Meanwhile, the upper wiring electrode 370 can be disposed on the second insulating layer 360. For example, the upper wiring electrode 370 can be a member that supplies an electrical signal to the semiconductor light emitting device 350, and can be electrically connected to the upper side of the semiconductor light emitting device 350. That is, after the second insulating layer 360 on the upper side of the semiconductor light emitting device 350 is removed to form a contact hole, the upper wiring electrode 370 can be electrically connected to the upper side of the semiconductor light emitting device 350 through a contact hole in the second insulating layer 360.

Meanwhile, the lower side of the semiconductor light emitting device 350 can be electrically connected to the second wiring 320. Accordingly, the second wiring 320 can be a lower wiring electrode for supplying an electrical signal to the semiconductor light emitting device 350.

After the semiconductor light emitting device 350 is assembled into the correct position in the assembly hole 341 by the dielectrophoresis force between the first wiring 310 and the second wiring 320, the lower side of the semiconductor light emitting device 350 can be electrically connected to the second wiring 320 through a bonding process. The lower side of the semiconductor light emitting device 350 and the second wiring 320 can be in face-to-face contact. For example, a positive (+) voltage can be supplied to the upper side of the semiconductor light emitting device 350 through the upper wiring electrode 370, and a negative (−) voltage can be supplied to the lower side of the semiconductor light emitting device 350 through the second wiring 320 or the lower side of the semiconductor light emitting device 350 can be grounded, so that light can be generated in the light emitting part 354 by the current I flowing through the semiconductor light emitting device 350.

According to the embodiment, the second wiring 320 can be an upper assembly wiring for assembling the semiconductor light emitting device 350 as well as a lower wiring electrode that supplies an electrical signal for causing the semiconductor light emitting device 350 to emit light. Accordingly, there is no need to provide separate wiring for supplying the electrical signal to the semiconductor light emitting device 350, so that the structure can be simple. In addition, there is no need to provide a separate wiring to supply an electrical signal to the semiconductor light emitting device 350, so that the gap between the first wiring 310 and the second wiring 320 can be further narrowed. Even if the pixel size becomes smaller to implement high resolution, it is possible to design the first wiring 310 and the second wiring 320 to sufficiently correspond to the reduced pixel size.

Meanwhile, the pad 330 can be also a lower wiring electrode for supplying an electrical signal to the semiconductor light emitting device 350. To this end, after the semiconductor light emitting device 350 is assembled in the assembly hole 341, the pad 330 and the second wiring 320 can be electrically connected.

Figure 16:
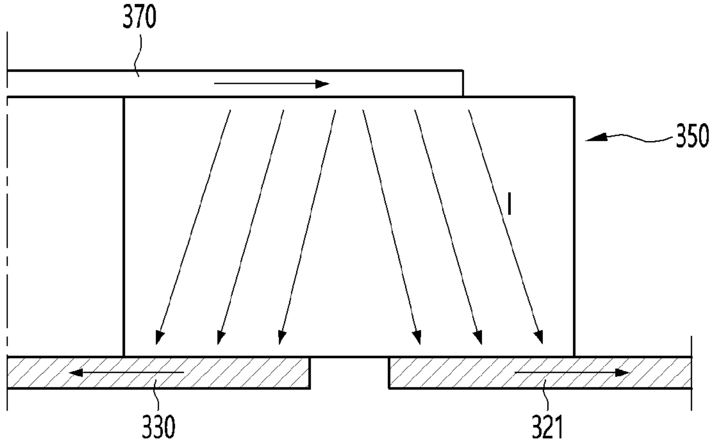
FIG. 16 shows a flow of current through a second wiring and a pad.

Accordingly, as shown in FIG. 16, an electrical signal can be supplied to the semiconductor light emitting device 350 not only through the second wiring 320 but also through the pad 330. If an electrical signal is supplied only through the second wiring 320, the second wiring 320 can be limited to one side of the lower side, that is, the right side, of the semiconductor light emitting device 350 and can be electrically connected, so that light generated in the semiconductor light emitting device 350 by the driving current I flowing between the upper wiring electrode 370 and the second wiring 320 can be also mainly generated in the right area of the semiconductor light emitting device 350, thereby deteriorating the luminous efficiency.

On the other hand, since the pad 330 is positioned on the other lower side, that is, on the left side, of the semiconductor light emitting device 350, When an electrical signal is supplied to the semiconductor light emitting device 350 by the pad 330 and the second wiring 320, light can be generated in the entire area of the semiconductor light emitting device 350 by the current I flowing from the upper wiring electrode 370 to the second wiring 320 and the current I flowing from the upper wiring electrode 370 to the pad 330, so that luminous efficiency can be improved. By improving luminous efficiency, brightness can be improved and high brightness can be obtained.

Meanwhile, the semiconductor light emitting device 350 can comprise a light emitting part 354, a lower electrode 355, and a passivation layer 356.

The light emitting part 354 can be a member that generates light and can comprise a first conductivity type semiconductor layer 351, an active layer 352, and a second conductivity type semiconductor layer 353. The first conductivity type semiconductor layer 351, the active layer 352, and the second conductivity type semiconductor layer 353 can be grown in batches using a deposition equipment such as MOCVD. The first conductivity type semiconductor layer 351, the active layer 352, and the second conductivity type semiconductor layer 353 can be made of a compound semiconductor material. For example, the compound semiconductor material can be a group 3-5 compound semiconductor material, a group 2-6 compound semiconductor material, etc. For example, the compound semiconductor material can comprise GaN, InGaN, AlN, AlInN, AlGaN, AlInGaN, InP, GaAs, GaP, GaInP, etc.

For example, the first conductivity type semiconductor layer 351 can comprise a first conductivity type dopant, and the second conductivity type semiconductor layer 353 can comprise a second conductivity type dopant. For example, the first conductivity type dopant can be an n-type dopant such as silicon (Si), and the second conductivity type dopant can be a p-type dopant such as boron (B).

The active layer 352 can be a region that generates light, and can generate light with a specific wavelength band depending on the material properties of the compound semiconductor. That is, the wavelength band can be determined by the energy band gap of the compound semiconductor comprised in the active layer 352. Therefore, depending on the energy band gap of the compound semiconductor comprised in the active layer 352, the semiconductor light emitting device 350 of the embodiment can generate UV light, blue light, green light, and red light.

The lower electrode 355 can comprise a metal with excellent electrical conductivity. Although not shown, the lower electrode 355 of the semiconductor light emitting device 350 can be electrically connected to the second wiring 320 and/or the pad 330 using a bonding metal.

Although not shown, an upper electrode can be provided on the upper side of the light emitting part 354. The upper electrode is a transparent member that transmits light and can comprise, for example, ITO.

The passivation layer 356 can block leakage current flowing on the surface of the light emitting part 354, prevent an electrical short between the first conductivity type semiconductor layer 351 and the second conductivity type semiconductor layer 353, and easily guide the semiconductor light emitting device 350 to the assembly hole 341. For example, the passivation layer 356 can be disposed on the remaining area except the lower side of the semiconductor light emitting device 350, so that that the semiconductor light emitting device 350 can be easily guided to the assembly hole 341 by the magnetic material during self-assembly. The passivation layer 356 can be formed of an inorganic insulating material, but is not limited thereto.

Although not shown, a magnetic layer can be provided so that the semiconductor light emitting device 350 can be moved by a magnetic material. The magnetic layer can be provided below or above the light emitting part 354. For example, the magnetic layer can be comprised in the lower electrode 355, but is not limited thereto.

The semiconductor light emitting device 350 of the embodiment can be a micro-LED with a micro-scale size or a nano-LED with a nano-scale size, but is not limited thereto. The semiconductor light emitting device 350 of the embodiment can have a cylindrical shape, a square shape, an oval shape, a plate shape, etc., but is not limited thereto.

Second Embodiment

Figure 22:
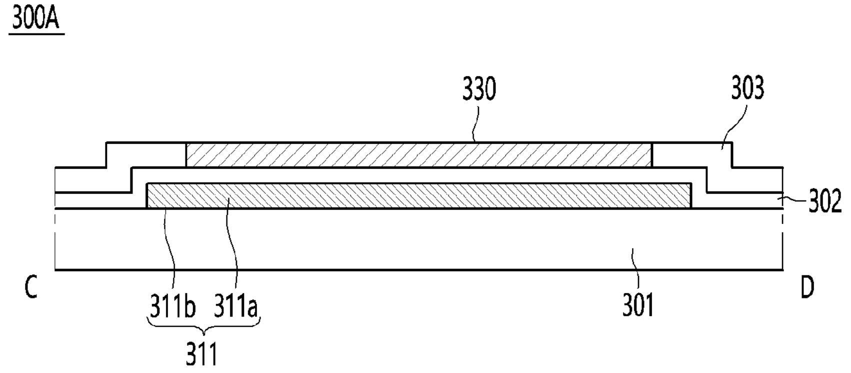
FIG. 22 is a cross-sectional view showing a display device according to a second embodiment.

FIG. 21 is a plan view showing a display device according to the second embodiment. FIG. 22 is a cross-sectional view showing a display device according to a second embodiment.

In the second embodiment, the second embodiment is the same as the first embodiment except for the case where the width W2 of the pad 330 in the second direction (y-axis direction) is smaller than the width W1 of the first extension part 311 in the second direction (y-axis direction). In the second embodiment, components having the same shape, structure, and/or function as those of the first embodiment are given the same reference numerals and detailed descriptions are omitted.

Referring to FIGS. 21 and 22, the display device 300A according to the second embodiment can comprise a first wiring 310, a first extension part 311, a second wiring 320, a second extension part 321, a pad 330, and a semiconductor light emitting device 350. The display device 300A according to the second embodiment can comprise more components, but is not limited thereto. In addition, the display device 300A according to the second embodiment shown in FIGS. 21 and 22 is only an example, and various modifications in structure, shape, and/or technology are possible.

An assembly hole 341 can be provided so that a portion of each of the first extension part 311 and the second extension part 321 can be exposed. A semiconductor light emitting device 350 can be disposed in the assembly hole 341.

The pad 330 can vertically overlap the first extension part 311. At this time, one end of the pad 330 can be vertically coincided with the first end 312 of the first extension part 311.

For example, the width W2 of the pad 330 in the second direction (y-axis direction) can be smaller than the width W1 of the first extension part 311 in the second direction (y-axis direction). Accordingly, portions of both sides of the first extension part 311 may not vertically overlap the pad 330.

The first extension part 311 can comprise a first extension area 311*a* that vertically overlaps the pad 330 and a second extension area 311*b* that does not overlap the pad 330. The second extension area can be positioned on both sides of the first extension area.

In this way, since the first extension area is covered by the pad 330, but the second extension area is not covered, an electric field can be generated between the second extension area and the second extension part 321. An electric field may be not generated between the first extension area and the second extension part 321. Therefore, the concentration of the electric field can be alleviated on the first extension part 311 when the pad 330 is provided compared to when the pad 330 is not provided, while being strengthened between the first extension part 311 and the second extension 321, the semiconductor light emitting device 350 can be correctly positioned in the assembly hole 341.

Accordingly, in the second embodiment, the contact area between the semiconductor light emitting device 350 and the second wiring 320 can increase, thereby preventing the semiconductor light emitting device 350 from being separated.

In the second embodiment, the contact area between the semiconductor light emitting device 350 and the second wiring 320 can increase, thereby improving light efficiency and implementing high luminance. In particular, when the pad 330 is electrically connected to the second wiring 320 after assembling the semiconductor light emitting device 350, light can be emitted from a wider area of the semiconductor light emitting device 350, thereby obtaining even higher luminance.

The second embodiment can improve image quality and improve product reliability by ensuring uniform luminance without luminance deviation between each pixel.

Third Embodiment

Figure 23:
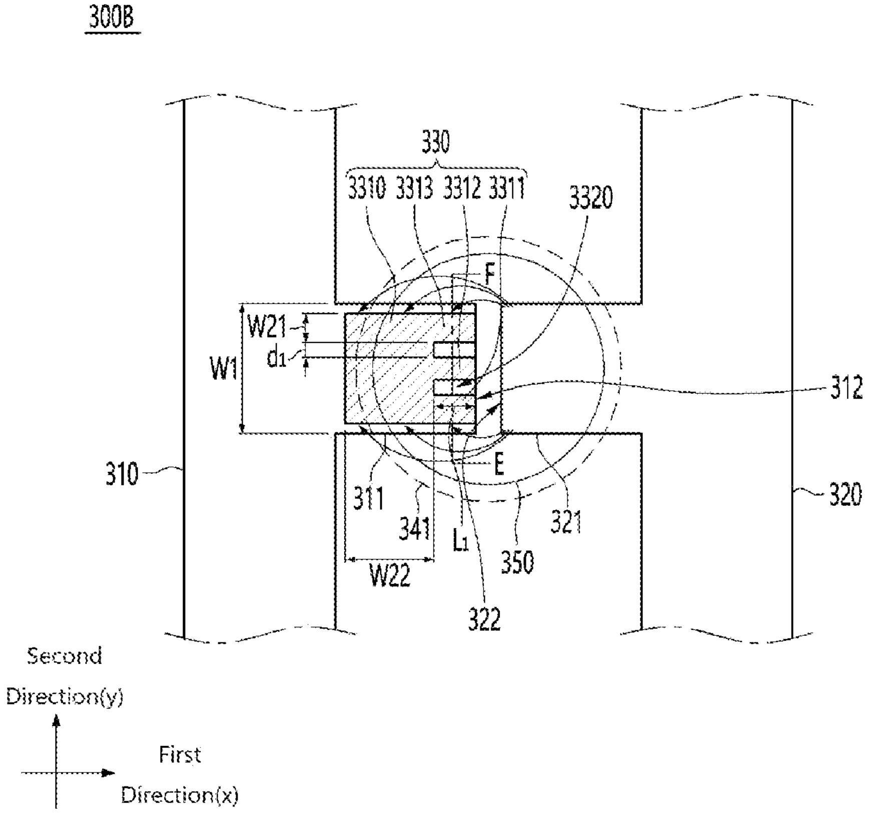
FIG. 23 is a plan view showing a display device according to a third embodiment.
Figure 24:
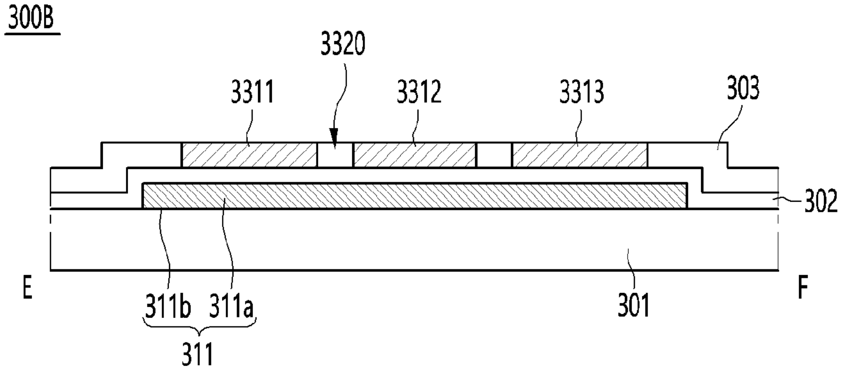
FIG. 24 is a cross-sectional view showing a display device according to a third embodiment.

FIG. 23 is a plan view showing a display device according to a third embodiment. FIG. 24 is a cross-sectional view showing a display device according to a third embodiment.

The third embodiment is the same as the first and second embodiments except for the shape of the pad 330. In the third embodiment, components having the same shape, structure, and/or function as those of the first and second embodiments are given the same reference numerals and detailed descriptions are omitted.

Referring to FIGS. 23 and 24, the display device 300B according to the third embodiment can comprise a first wiring 310, a first extension part 311, a second wiring 320, a second extension part 321, a pad 330, and a semiconductor light emitting device 350. The display device 300B according to the third embodiment can comprise more components, but is not limited thereto. In addition, the display device 300B according to the third embodiment shown in FIGS. 23 and 24 is only an example, and various modifications in structure, shape, and/or technology are possible.

The pad 330 can comprise a connection part 3310 and a plurality of branch parts 3311 to 3313.

The plurality of branch parts 3311 to 3313 can extend from the connection part 3310 toward the second extension part 321 along the first direction (x-axis direction), and can be separated from each other along the second direction (y-axis direction). Although three branch parts 3311 to 3313 are shown in FIG. 23, more branch parts can be provided.

The connection part 3310 can connect a plurality of branch parts 3311 to 3313. The space between the plurality of branch parts 3311 to 3313 can form a groove part 3320. The groove part 3320 can be an area where the branch parts 3311 to 3313 are not disposed. For example, the first extension part 311 corresponding to the groove part 3320 may be not covered by the pad 330. Therefore, the electric field can be generated only between the first extension part 311 and the second extension part 321 corresponding to the groove part 3320, and the semiconductor light emitting device 350 can be assembled within the assembly hole 341 by the dielectrophoresis force formed by the electric field.

For example, the distance d1 between the branch parts 3311 to 3313 can be smaller than the width W21 of the branch parts 3311 to 3313 in the second direction (y-axis direction). For example, the distance d1 between the branch parts 3311 to 3313 can be equal to the width W21 of the branch parts 3311 to 3313 in the second direction (y-axis direction). In this way, by adjusting the distance d1 between the branch parts 3311 to 3313 to adjust the area of the first extension part 311 not covered by the pad 330, the concentration of the electric field can be alleviated on the first extension part 31, while being strengthened between the first extension part 311 and the second extension part 321, so that the semiconductor light emitting device 350 can be correctly positioned in the assembly hole 341.

For example, the length L1 of the branch parts 3311 to 3313 in the first direction (x-axis direction) can be smaller than the width W22 of the connection part 3310 in the first direction (x-axis direction). For example, the length L1 of the branch parts 3311 to 3313 along the first direction (x-axis direction) can be equal to the width W22 of the connection part 3310 along the first direction (x-axis direction). In this way, by adjusting the length L1 of the branch parts 3311 to 3313 to adjust the area of the first extension part 311 not covered by the pad 330, so that that the electric field concentrated on the first extension part 311 may be concentrated between the first extension part 311 and the second extension 321, that is, at the center of the assembly hole 341. Thus, the semiconductor light emitting device 350 can be correctly positioned in the assembly hole 341.

For example, both the width W21 of the branch parts 3311 to 3313 and the length L1 of the branch parts 3311 to 3313 can be adjusted.

Meanwhile, the first extension part 311 can comprise a first extension area 311*a* and a second extension area 311*b*, as shown in FIG. 24. For example, the first extension area 311*a* can vertically overlap each of the plurality of branch parts 3311 to 3313. For example, the second extension area 311*b* may not overlap each of the plurality of branch parts 3311 to 3313.

The end of each of the plurality of branch parts 3311 to 3313 can vertically coincide with the end of the first extension area, that is, the first end 312 of the first extension part 311.

Although not shown, the ends of each of the plurality of branch parts 3311 to 3313 may not coincide with the ends of the first extension area. That is, the ends of each of the plurality of branch parts 3311 to 3313 can be positioned spaced apart from the end of the first extension area toward the connection part 3310. Accordingly, each of the plurality of branch parts 3311 to 3313 may not overlap with a portion of the first extension area. In this instance, an electric field is generated between a portion of the first extension area and the second extension part 321, and this electric field can contribute to positioning the semiconductor light emitting device 350 at the center of the assembly hole 341.

When the pad 330 is not provided, the electric field concentrated on the first extension part 311 can be concentrated at the center of the assembly hole 341. That is, the remaining area excluding the groove part 3320 is disposed on the pad 330 and the first extension part 311 can be covered by the pad 330, so that an electric field may not be generated or may be weakly generated between the first extension part 311 and the second extension part 321 corresponding to the pad 330. Therefore, compared to when the pad 330 is not provided, the pad 330 of the third embodiment can be provided, so that the electric field can be concentrated between the first extension part 311 and the second extension part 321. Thus, the semiconductor light emitting device 350 can be correctly positioned in the assembly hole 341.

Accordingly, in the third embodiment, the contact area between the semiconductor light emitting device 350 and the second wiring 320 can increase, thereby preventing the semiconductor light emitting device 350 from being separated.

In the third embodiment, the contact area between the semiconductor light emitting device 350 and the second wiring 320 can increase, thereby improving light efficiency and implementing high luminance. In particular, when the pad 330 is electrically connected to the second wiring 320 after assembling the semiconductor light emitting device 350, light can be emitted from a wider area of the semiconductor light emitting device 350, thereby obtaining even higher luminance.

The third embodiment can improve image quality and improve product reliability by ensuring uniform luminance without luminance deviation between each pixel.

Fourth Embodiment

Figure 25:
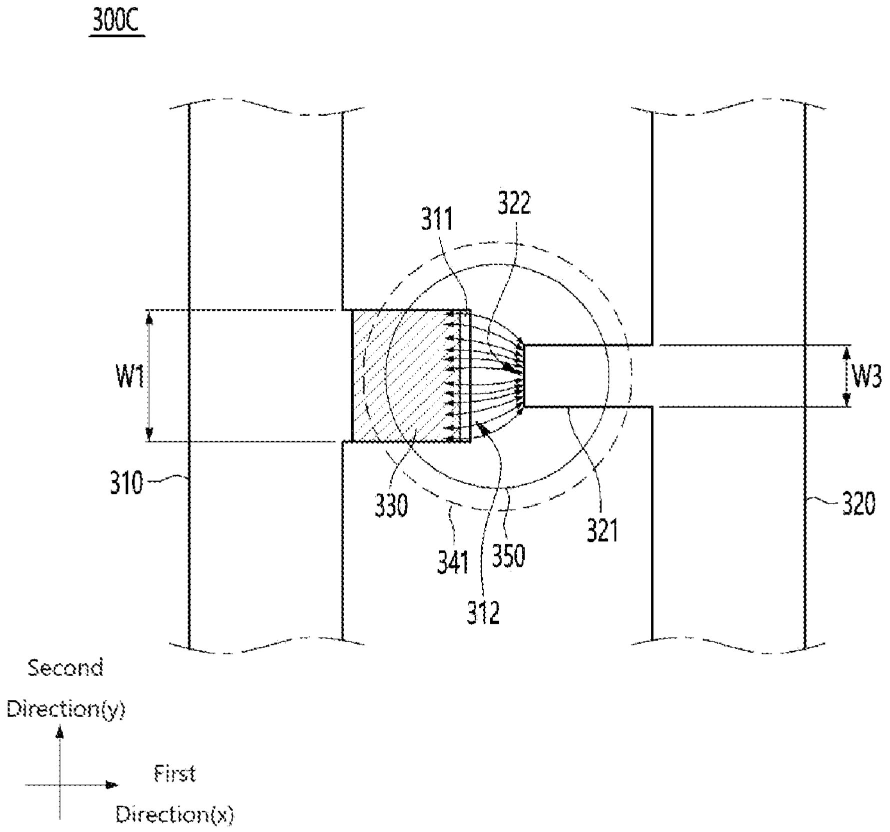
FIG. 25 is a plan view showing a display device according to a fourth embodiment.

FIG. 25 is a plan view showing a display device according to a fourth embodiment.

The fourth embodiment is the same as the first to third embodiments except that the sizes (or areas) of the first extension part 311 and the second extension part 321 are different. In the fourth embodiment, components having the same shape, structure, and/or function as those of the first to third embodiments are given the same reference numerals and detailed descriptions are omitted.

Referring to FIG. 25, the display device 300C according to the fourth embodiment can comprise a first wiring 310, a first extension part 311, a second wiring 320, a second extension part 321, a pad 330 and a semiconductor light emitting device 350. The display device 300C according to the fourth embodiment can comprise more components than these, but is not limited thereto. In addition, the display device 300C according to the fourth embodiment shown in FIG. 25 is only an example, and various modifications in structure, shape, and/or technology are possible.

The size of the first extension part 311 and the size of the second extension part 321 can be different. For example, the size of the second extension part 321 can be smaller than the size of the first extension part 311. For example, the width W3 of the second extension part 321 in the second direction (y-axis direction) can be smaller than the width W1 of the first extension part 311 in the second direction (y-axis direction). Accordingly, the electric field between the first extension part 311 and the second extension part 321 can be guided to be concentrated on the first extension part 311. That is, the electric field can be dispersed since the size of the first extension part 311 is large, whereas the electric field can be concentrated since the size of the second extension part 321 is small. Therefore, as the first extension part 311 and the second extension part 321 are disposed in different layers, the electric field concentrated on the first extension part 311 can make the size of the second extension part 321 smaller than the size of the first extension part 311. Thus, by concentrating the electric field between the first extension part 311 and the second extension part 321, the semiconductor light emitting device 350 can be positioned between the first extension part 311 and the second extension part 321, that is, at the center of the assembly hole 341.

Meanwhile, a pad 330 can be disposed on the first extension part 311. In this instance, the size (or area) of the pad 330 and the size of the second extension part 321 can be different.

The size of the pad 330 can be smaller than the size of the first extension part 311. For example, a portion of the first extension part 311 can vertically overlap the pad 330, and another portion of the first extension part 311 may not overlap the pad 330. An electric field can be generated between another portion of the first extension part 311 and the second extension part 321. Considering the size of other parts of the first extension part 311 and the reduction ratio of the size of the second extension 321 compared to the size of the first extension part 311, etc., the electric field can be adjusted to be concentrated at the center of the assembly hole 341.

For example, when the pad 330 is not provided, the size of the second extension part 321 can be greatly reduced compared to the size of the first extension part 311, so that that the electric field can be adjusted to be concentrated at the center of the assembly hole 341.

For example, when the pad 330 is provided, compared to when the pad 330 is not provided, the size of the second extension part 321 can be reduced less than that of the first extension part 311, and the size of the other part of the first extension part 311 that does not overlap the pad 330 can be reduced, the electric field can be adjusted to be concentrated at the center of the assembly hole 341.

Accordingly, in the fourth embodiment, the contact area between the semiconductor light emitting device 350 and the second wiring 320 can increase, thereby preventing the semiconductor light emitting device 350 from being separated.

In the fourth embodiment, the contact area between the semiconductor light emitting device 350 and the second wiring 320 can increase, thereby improving light efficiency and implementing high luminance. In particular, when the pad 330 is electrically connected to the second wiring 320 after assembling the semiconductor light emitting device 350, light can be emitted from a wider area of the semiconductor light emitting device 350, thereby obtaining even higher luminance.

The fourth embodiment can improve image quality and improve product reliability by securing uniform luminance without luminance deviation between each pixel.

Fifth Embodiment

Figure 26:
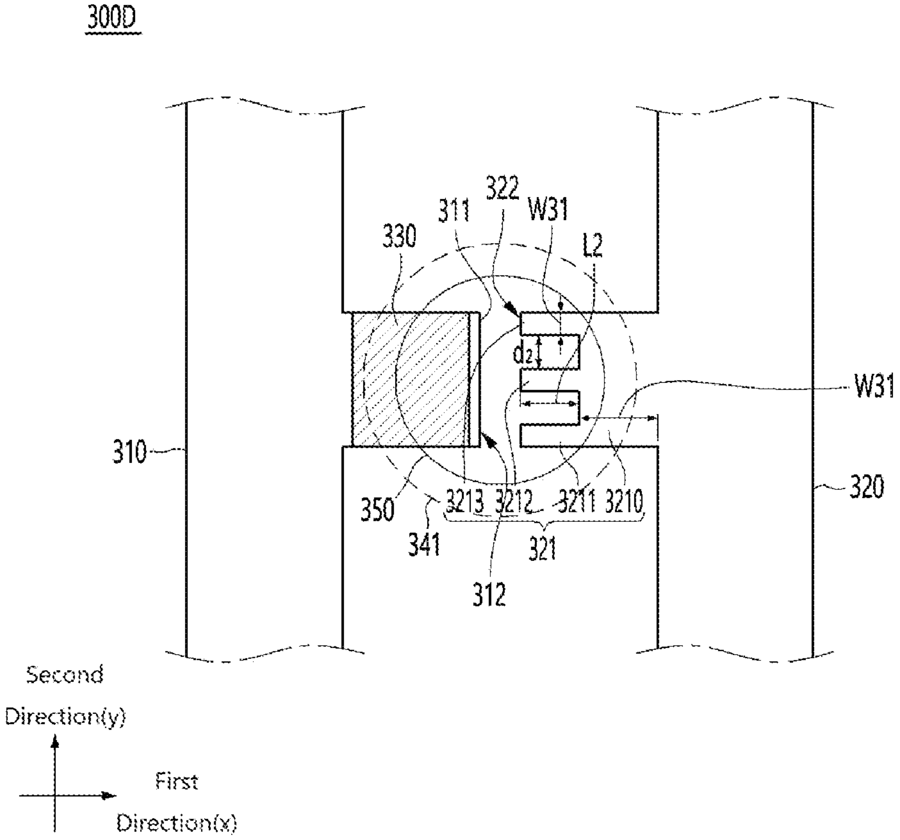
FIG. 26 is a plan view showing a display device according to a fifth embodiment.

FIG. 26 is a plan view showing a display device according to a fifth embodiment.

The fifth embodiment is the same as the first to fourth embodiments except for the shape of the second extension part 321. In the fifth embodiment, components having the same shape, structure, and/or function as those of the first to fourth embodiments are given the same reference numerals and detailed descriptions are omitted.

Referring to FIG. 26, the display device 300D according to the fourth embodiment can comprise a first wiring 310, a first extension part 311, a second wiring 320, a second extension part 321, a pad 330 and a semiconductor light emitting device 350. The display device 300D according to the fourth embodiment can comprise more components than these, but is not limited thereto. In addition, the display device 300D according to the second embodiment shown in FIG. 26 is only an example, and various modifications in structure, shape, and/or technology are possible.

The second extension part 321 can comprise a connection part 3210 and a plurality of branch parts 3211 to 3213. The plurality of branch parts 3211 to 3213 can extend from the connection part 3210 toward the first extension part 311 along a direction (−x-axis direction) opposite to the first direction (x-axis direction) and extend in a second direction (y can be spaced apart from each other along the axial direction.

For example, the distance d2 between the plurality of branch parts 3211 to 3213 can be greater than the width W31 of the branch parts 3211 to 3213 in the second direction (y-axis direction). For example, the distance d2 between the branch parts 3211 to 3213 can be equal to the width W31 of the branch parts 3211 to 3213 in the second direction (y-axis direction). Accordingly, since the width W31 of the branch parts 3211 to 3213 is small, the size of the branch parts 3211 to 3213 can be also small. As the size of the branch parts 3211 to 3213 decreases, the electric field between the first extension part 311 and the second extension part 321 can be concentrated on each of the branch parts 3211 to 3213 of the second extension part 321. Accordingly, as the first extension part 311 and the second extension part 321 are disposed in different layers, the concentration of the electric field can be alleviated on the first extension part 311, while being strengthened between the first extension part 311 and the second extension part 321, the semiconductor light emitting device 350 can be correctly positioned in the assembly hole 341.

For example, the length L2 of the branch parts 3211 to 3213 in the first direction (x-axis direction) can be smaller than the width W31 of the connection part 3210 in the first direction (x-axis direction). For example, the length L2 of the branch parts 3211 to 3213 along the first direction (x-axis direction) can be equal to the width W31 of the connection part 3210 along the first direction (x-axis direction). Accordingly, since the length L2 of the branch parts 3211 to 3213 is small, the size of the branch parts 3211 to 3213 can be also small. As the size of the branch parts 3211 to 3213 decreases, the electric field between the first extension part 311 and the second extension part 321 can be concentrated on each of the branch parts 3211 to 3213 of the second extension part 321. Accordingly, as the first extension part 311 and the second extension part 321 are disposed in different layers, the concentration of the electric field can be alleviated on the first extension part 311, while being strengthened between the first extension part 311 and the second extension part 321, the semiconductor light emitting device 350 can be correctly positioned in the assembly hole 341.

For example, both the width W31 of the branch parts 3211 to 3213 and the length L2 of the branch parts 3211 to 3213 can be adjusted.

Meanwhile, since the arrangement relationship between the pad 330 and the first extension part 311 has been described in detail in the first to fourth embodiments, detailed descriptions are omitted.

Accordingly, in the fifth embodiment, the contact area between the semiconductor light emitting device 350 and the second wiring 320 can increase, thereby preventing the semiconductor light emitting device 350 from being separated.

In the fifth embodiment, the contact area between the semiconductor light emitting device 350 and the second wiring 320 can increase, thereby improving light efficiency and implementing high luminance. In particular, when the pad 330 is electrically connected to the second wiring 320 after assembling the semiconductor light emitting device 350, light can be emitted from a wider area of the semiconductor light emitting device 350, thereby obtaining even higher luminance.

The fifth embodiment can improve image quality and improve product reliability by ensuring uniform luminance without luminance deviation between each pixel.

The above detailed description should not be construed as limiting in all respects and should be considered illustrative. The scope of the embodiment should be determined by reasonable interpretation of the appended claims, and all changes within the equivalent range of the embodiment are comprised in the scope of the embodiment.

INDUSTRIAL APPLICABILITY

The embodiment can be adopted in the field of displays that display images or information.

The embodiment can be adopted in the field of displays that display images or information using semiconductor light emitting devices.

The embodiment can be adopted in the field of displays that display images or information using micro-level or nano-level semiconductor light emitting devices.

The invention claimed is:

1. A display device, comprising:
- a first wiring;
- a second wiring disposed on a different layer from the first wiring;
- a pad disposed on the same layer as the second wiring and that vertically overlaps the first wiring;
- an insulating layer disposed on the pad and the second wiring and having an assembly hole; and
- a semiconductor light emitting device disposed on the pad and the second wiring in the assembly hole,
- wherein the first wiring comprises a first extension part extending toward the second wiring,
- wherein the second wiring comprises a second extension part extending toward the first wiring,
- wherein the pad vertically overlaps the first extension part,
- wherein the semiconductor light emitting device is disposed on the pad and the second extension part within the assembly hole,
- wherein the first extension part comprises:
  - a first extension area that extends toward the second wiring and vertically overlaps the pad; and
  - a second extension area that extends from the first extension area toward the second wiring and does not vertically overlap the pad.

2. The display device of claim 1, wherein the second wiring is an upper assembly wiring for assembling the semiconductor light emitting device together with the first wiring.

3. The display device of claim 1, wherein the pad and the second wiring are lower wire electrodes for supplying an electrical signal to the semiconductor light emitting device.

4. The display device of claim 3, wherein the second wiring and the pad are electrically connected.

5. The display device of claim 1, wherein the pad is an alleviation member that alleviates a dielectrophoretic force concentrated on the first wiring.

6. The display device of claim 1, wherein the pad comprises:
- a first pad area that vertically overlaps the assembly hole; and
- a second pad area that does not overlap the assembly hole.

7. The display device of claim 6, wherein an area of the first pad area is greater than an area of the second pad area.

8. The display device of claim 1, wherein a width of the pad is less than or equal to a width of the first extension part.

9. The display device of claim 1, wherein a width of the second extension area in a first direction is 0 to 50% of a width of the first extension part in the first direction.

10. The display device of claim 1, wherein the pad comprises:
- a connection part; and
- a plurality of branch parts extending from the connection part toward the second extension part and being spaced apart from each other.

11. The display device of claim 10, wherein a distance between the plurality of branch parts is smaller than a width of one of the plurality of branch parts.

12. The display device of claim 10, wherein a length of one of the plurality of branch parts along a first direction is smaller than a width of the connection part along the first direction.

13. The display device of claim 10, wherein the first extension part comprises:
- a first extension area that vertically overlaps one of the plurality of branch parts; and
- a second extension area that does not vertically overlap the one of the plurality of branch parts.

14. The display device of claim 13, wherein an end of the one of the plurality of branch vertically coincides with an end of the first extension area.

15. The display device of claim 10, wherein spaces between the plurality of branch parts form groove parts.

16. The display device of claim 15, wherein each groove part is positioned over the first extension part between adjacent branch parts among the plurality of branch parts.

17. The display device of claim 10, wherein each branch part of the plurality of branch parts extends toward the second extension part along a first direction and is spaced apart from adjacent branch parts among the plurality of branch parts along a second direction.

* * * * *